(12) United States Patent
Lin et al.

(10) Patent No.: US 11,856,785 B2
(45) Date of Patent: Dec. 26, 2023

(54) MEMORY ARRAY AND METHODS OF FORMING SAME

(71) Applicant: Taiwan Semiconductor Manufacturing Co., Ltd., Hsinchu (TW)

(72) Inventors: Yu-Ming Lin, Hsinchu (TW); Bo-Feng Young, Taipei (TW); Sai-Hooi Yeong, Zhubei (TW); Han-Jong Chia, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/884,062

(22) Filed: Aug. 9, 2022

(65) Prior Publication Data

US 2022/0384461 A1    Dec. 1, 2022

Related U.S. Application Data

(62) Division of application No. 17/186,852, filed on Feb. 26, 2021.

(60) Provisional application No. 63/148,639, filed on Feb. 12, 2021.

(51) Int. Cl.
*H10B 51/30* (2023.01)
*G11C 8/14* (2006.01)
*H10B 51/10* (2023.01)
*H10B 51/20* (2023.01)

(52) U.S. Cl.
CPC ............... *H10B 51/30* (2023.02); *G11C 8/14* (2013.01); *H10B 51/10* (2023.02); *H10B 51/20* (2023.02)

(58) Field of Classification Search
CPC .......... G11C 8/14; H10B 51/10; H10B 51/20; H10B 51/30
See application file for complete search history.

(56) References Cited

U.S. PATENT DOCUMENTS

| | | | |
|---|---|---|---|
| 2002/0028541 A1 | 3/2002 | Lee et al. | |
| 2010/0140679 A1 | 6/2010 | Walker | |
| 2015/0179577 A1 | 6/2015 | Tobitsuka et al. | |
| 2020/0075631 A1 | 3/2020 | Dong et al. | |
| 2020/0185411 A1* | 6/2020 | Herner | H10B 43/20 |
| 2021/0118900 A1 | 4/2021 | Jiang et al. | |

* cited by examiner

Primary Examiner — Meiya Li
(74) Attorney, Agent, or Firm — Slater Matsil, LLP

(57) ABSTRACT

A device includes a semiconductor substrate; a first word line over the semiconductor substrate, the first word line providing a first gate electrode for a first transistor; and a second word line over the first word line. The second word line is insulated from the first word line by a first dielectric material, and the second word line providing a second gate electrode for a second transistor over the first transistor. The device further including a source line intersecting the first word line and the second word line; a bit line intersecting the first word line and the second word line; a memory film between the first word line and the source line; and a first semiconductor material between the memory film and the source line.

20 Claims, 50 Drawing Sheets

MEMORY ARRAY AND METHODS OF FORMING SAME

PRIORITY CLAIM AND CROSS-REFERENCE

This application is a divisional of U.S. application Ser. No. 17/186,852, filed on Feb. 26, 2021, which claims the benefit of U.S. Provisional Application No. 63/148,639, filed on Feb. 12, 2021, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
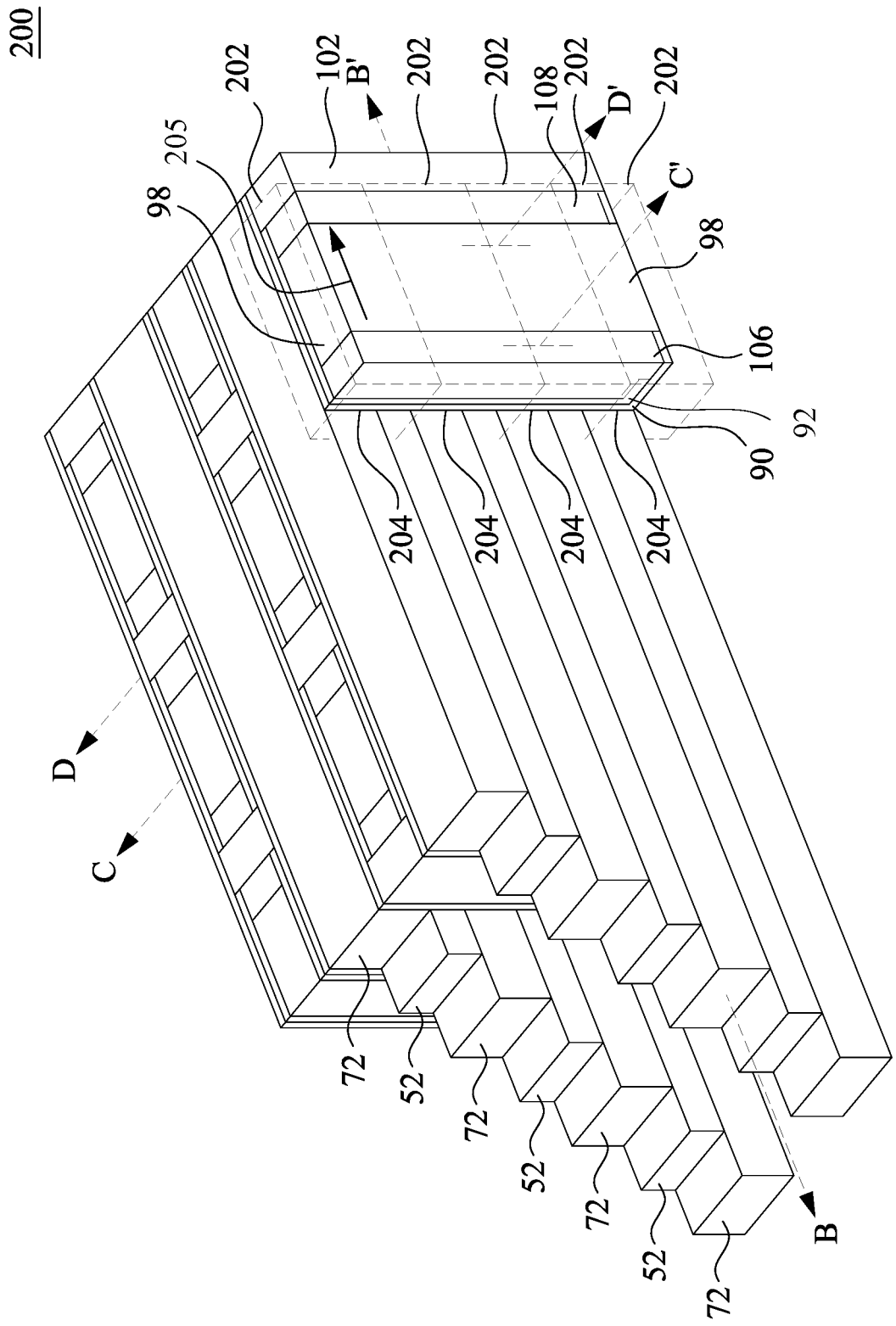
FIGS. 1A, 1B, and 1C illustrate a perspective view, a circuit diagram, and a top down view of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a three dimensional (3D) memory array with a plurality of vertically stacked memory cells. Each memory cell includes a thin film transistor (TFT) having a word line region acting as a gate electrode, a bit line region acting as a first source/drain electrode, and a source line region acting as a second source/drain electrode. Each TFT further includes an insulating memory film (e.g., as a gate dielectric) and an oxide semiconductor (OS) channel region. In some embodiments, the word lines may run in a horizontal direction (e.g., parallel to a major surface of a semiconductor substrate) while the source lines and bit lines may run in a vertical direction (e.g., perpendicular to a major surface of the semiconductor substrate). Advantages may be achieved with the 3D memory array architecture including but not limited to reduced memory cell size, increased density, reduced memory array footprint (e.g., stacking height), and manufacturing ease.

Figure 1B:
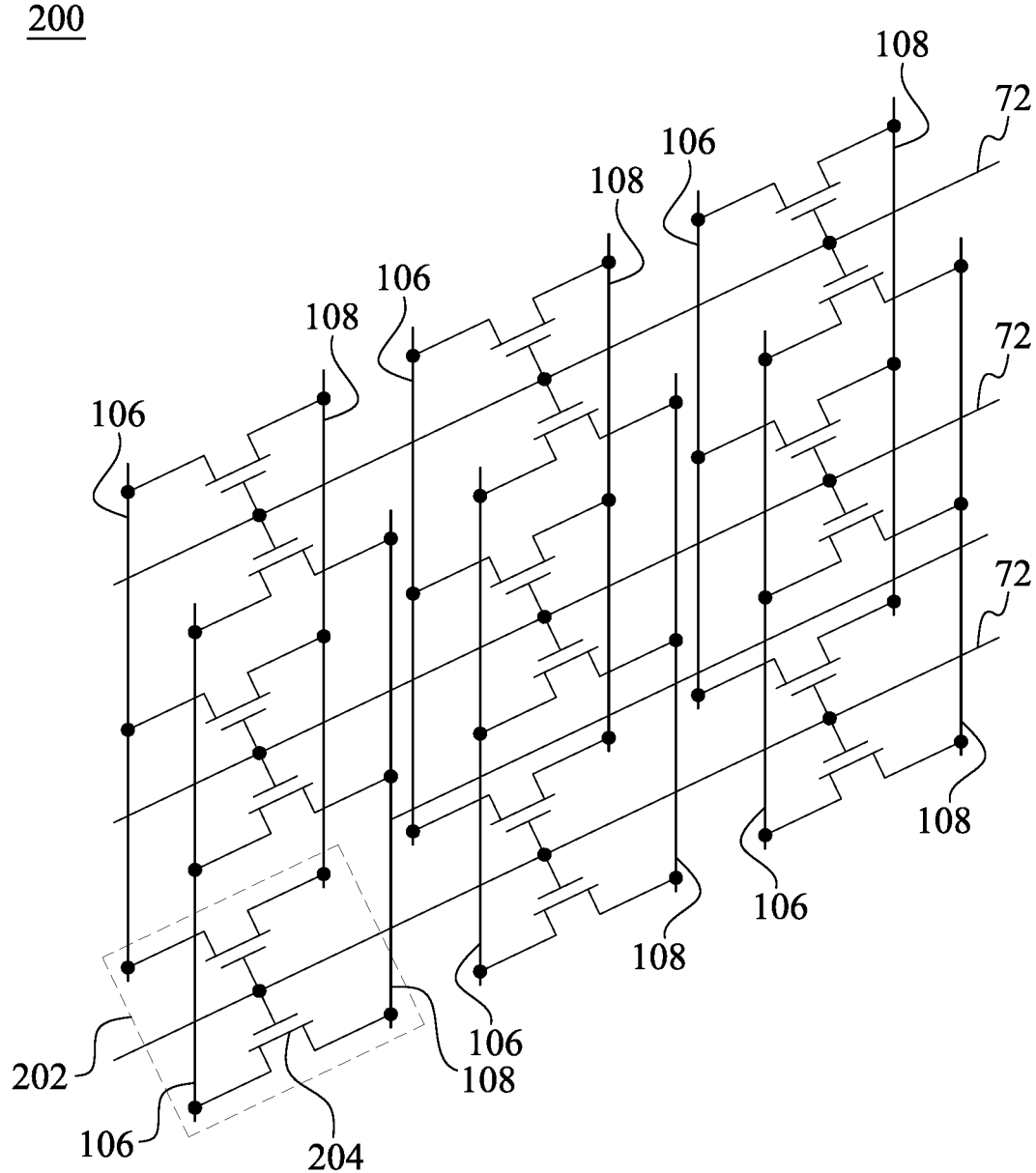
Figure 1C:
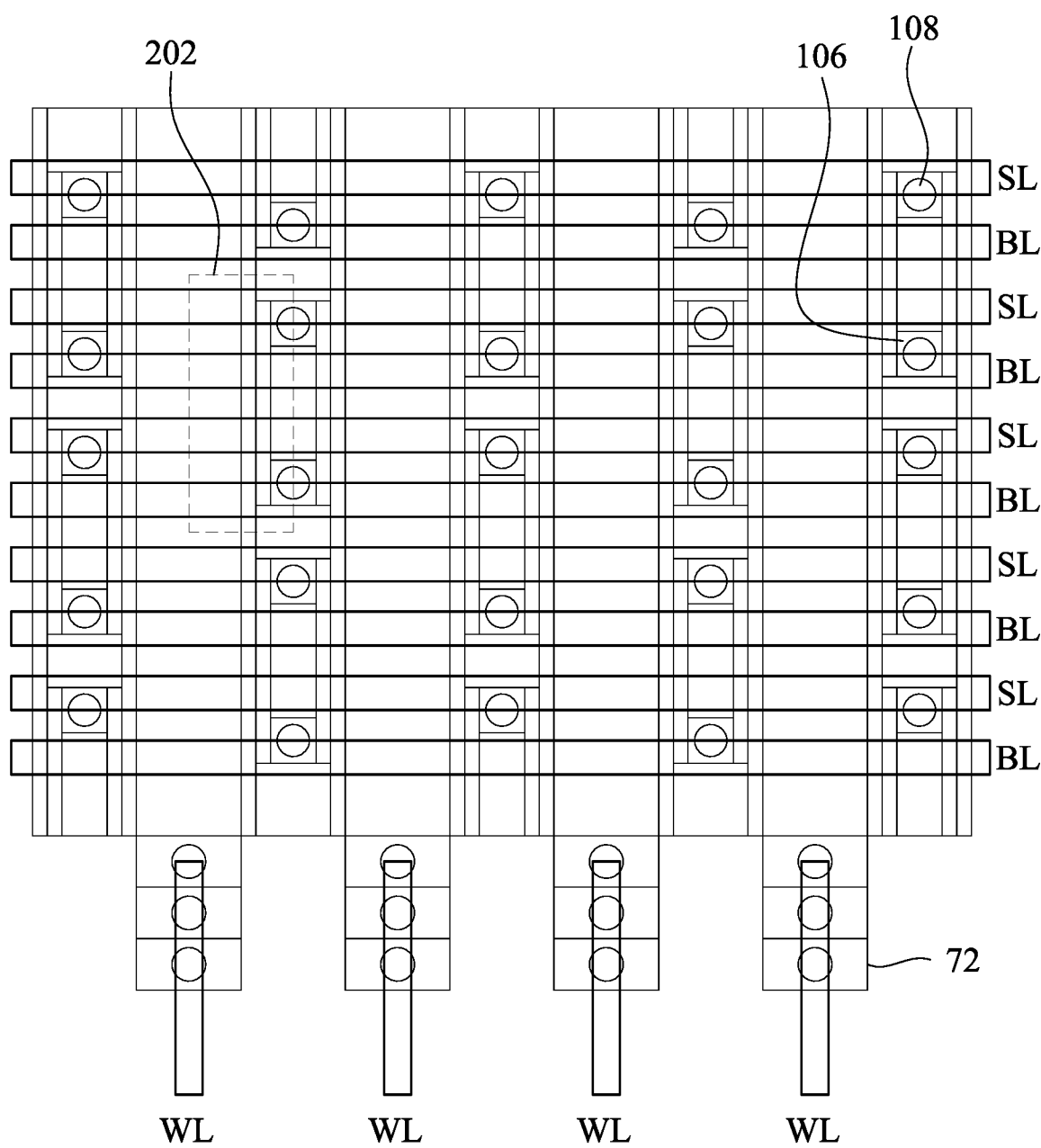

FIGS. 1A, 1B, and 1C illustrate examples of a memory array according to some embodiments. FIG. 1A illustrates an example of a portion of the memory array 200 in a three-dimensional view; FIG. 1B illustrates a circuit diagram of the memory array 200; and FIG. 1C illustrates a top down view of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory array 200 is a flash memory array, such as a NOR flash memory array, or the like. Each memory cell 202 may include a thin film transistor (TFT) 204 with an insulating, memory film 90 as a gate dielectric. In some embodiments, a gate of each TFT 204 is provided by a portion of a respective word line (e.g., conductive line 72), a first source/drain region of each TFT 204 is provided by a portion of a respective bit line (e.g., conductive line 106), and a second source/drain region of each TFT 204 is provided by a portion of a respective source line (e.g., conductive line 108), which electrically couples the second source/drain region to ground. The memory cells 202 in a same horizontal row of the memory array 200 may share a common word line while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., bit lines) and conductive lines 108 (e.g., source lines). The conductive lines 106 and 108 may each extend in a direction perpendicular to the conductive lines 72. A dielectric material 98 is disposed between and isolates adjacent ones of the conductive lines 106 and the conductive lines 108. Pairs of the conductive lines 106 and 108 along with an intersecting conductive line 72 define boundaries of each memory cell 202, and a dielectric material 102 is disposed between and isolates adjacent pairs of the conductive lines 106 and 108. In some embodiments, the conductive lines 108 are electrically coupled to ground. Although FIGS. 1A and 1C illustrate a particular placement of the conductive lines 106 relative the conductive lines 108, it should be appreciated that the placement of the conductive lines 106 and 108 may be flipped in other embodiments. Further, in FIGS. 1A and 1C, conductive lines 106 and 108 in adjacent columns of the memory array 200 may be staggered from each other for improved isolation between the memory cells 202. In other embodiments, the conductive lines 106 and 108 may have a different configuration (e.g., aligned).

As discussed above, the memory array 200 may also include an oxide semiconductor (OS) layer 92. The OS layer 92 may provide channel regions for the TFTs 204 of the memory cells 202. For example, when an appropriate voltage (e.g., higher than a respective threshold voltage ($V_{th}$) of a corresponding TFT 204) is applied through a corresponding conductive line 72, a region of the OS layer 92 that intersects the conductive line 72 may allow current to flow from the conductive lines 106 to the conductive lines 108 (e.g., in the direction indicated by arrow 205).

A memory film 90 is disposed between the conductive lines 72 and the OS layer 92, and the memory film 90 may provide gate dielectrics for the TFTs 204. In some embodiments, the memory film 90 comprises a ferroelectric material, such as a hafnium oxide, hafnium zirconium oxide, silicon-doped hafnium oxide, or the like. Accordingly, the memory array 200 may also be referred to as a ferroelectric random access memory (FERAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

In embodiments where the memory film 90 comprises a ferroelectric material, the memory film 90 may be polarized in one of two different directions, and the polarization direction may be changed by applying an appropriate voltage differential across the memory film 90 and generating an appropriate electric field. The polarization may be relatively localized (e.g., generally contained within each boundaries of the memory cells 202), and a continuous region of the memory film 90 may extend across a plurality of memory cells 202. Depending on a polarization direction of a particular region of the memory film 90, a threshold voltage of a corresponding TFT 204 varies, and a digital value (e.g., 0 or 1) can be stored. For example, when a region of the memory film 90 has a first electrical polarization direction, the corresponding TFT 204 may have a relatively low threshold voltage, and when the region of the memory film 90 has a second electrical polarization direction, the corresponding TFT 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory film 90 corresponding to the memory cell 202. The write voltage can be applied, for example, by applying appropriate voltages to a corresponding conductive line 72 (e.g., the word line) and the corresponding conductive lines 106/108 (e.g., the bit line/source line). By applying the write voltage across the portion of the memory film 90, a polarization direction of the region of the memory film 90 can be changed. As a result, the corresponding threshold voltage of the corresponding TFT 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the word line). Depending on the polarization direction of the corresponding region of the memory film 90, the TFT 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation.

FIG. 1A further illustrates reference cross-sections of the memory array 200 that are used in later figures. Cross-section B-B' is along a longitudinal axis of conductive lines 72 and in a direction, for example, parallel to the direction of current flow of the TFTs 204. Cross-section C-C' is perpendicular to cross-section B-B' and is parallel to a longitudinal axis of the conductive lines 72. Cross-section C-C' extends through the conductive lines 106. Cross-section D-D' is parallel to cross-section C-C' and extends through the dielectric material 102. Subsequent figures refer to these reference cross-sections for clarity.

Figure 2:
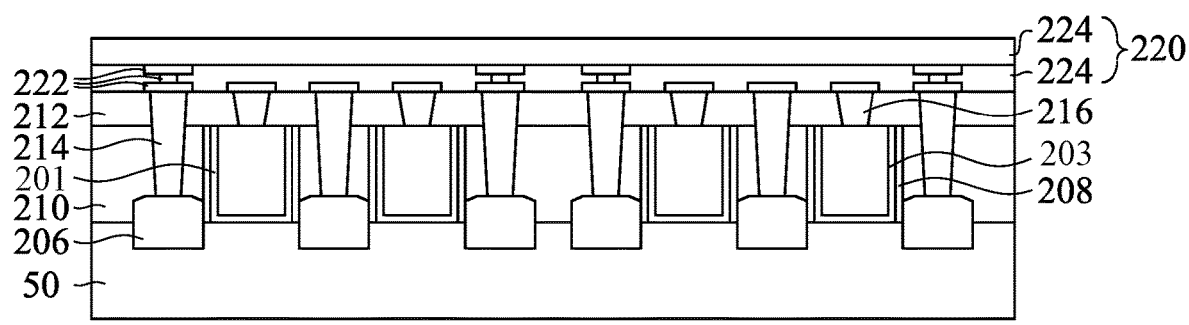
FIGS. 2, 3A, 3B, 4, 5, 6, 7, 8, 9, 10, 11, 12A, 12B, 13, 14, 15, 16, 17A, 17B, 18A, 18B, 19A, 19B, 20, 21, 22, 23A, 23B, 23C, 24A, 24B, 24C, 25A, 25B, 25C, 26A, 26B, 26C, 27A, 27B, 27C, 28A, 28B, 28C, and 28D illustrate varying views of manufacturing a memory array in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 201 over top surfaces of the substrate 50 and gate electrodes 204 over the gate dielectric layers 201. Source/drain regions 206 are disposed in the substrate 50 on opposite sides of the gate dielectric layers 201 and the gate electrodes 204. Gate spacers 208 are formed along sidewalls of the gate dielectric layers 201 and separate the source/drain regions 206 from the gate electrodes 203 by appropriate lateral distances. In some embodiments, the transistors may be planar field effect transistors (FETs), fin field effect transistors (finFETs), nano-field effect transistors (nanoFETs), or the like.

A first interlayer dielectric (ILD) 210 surrounds and isolates the source/drain regions 206, the gate dielectric layers 201, and the gate electrodes 203 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 203. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 220 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
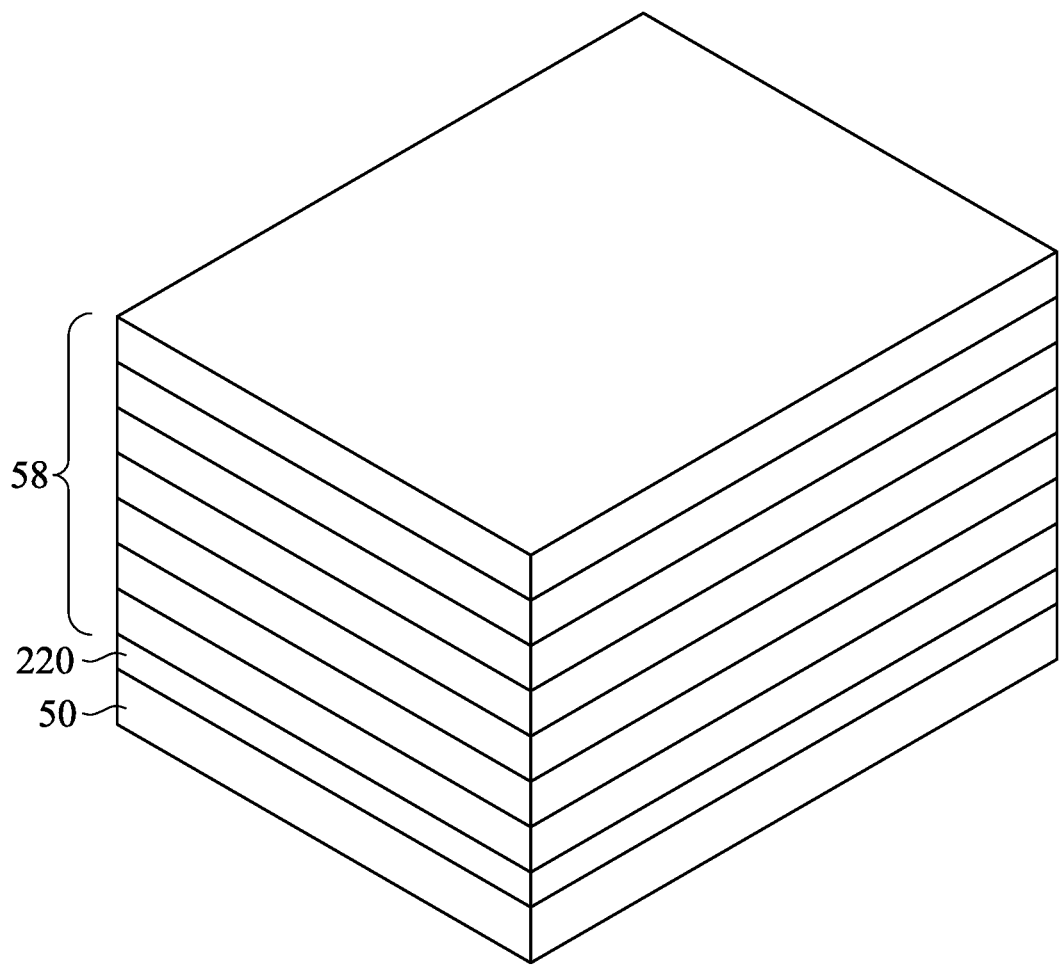
Figure 3B:
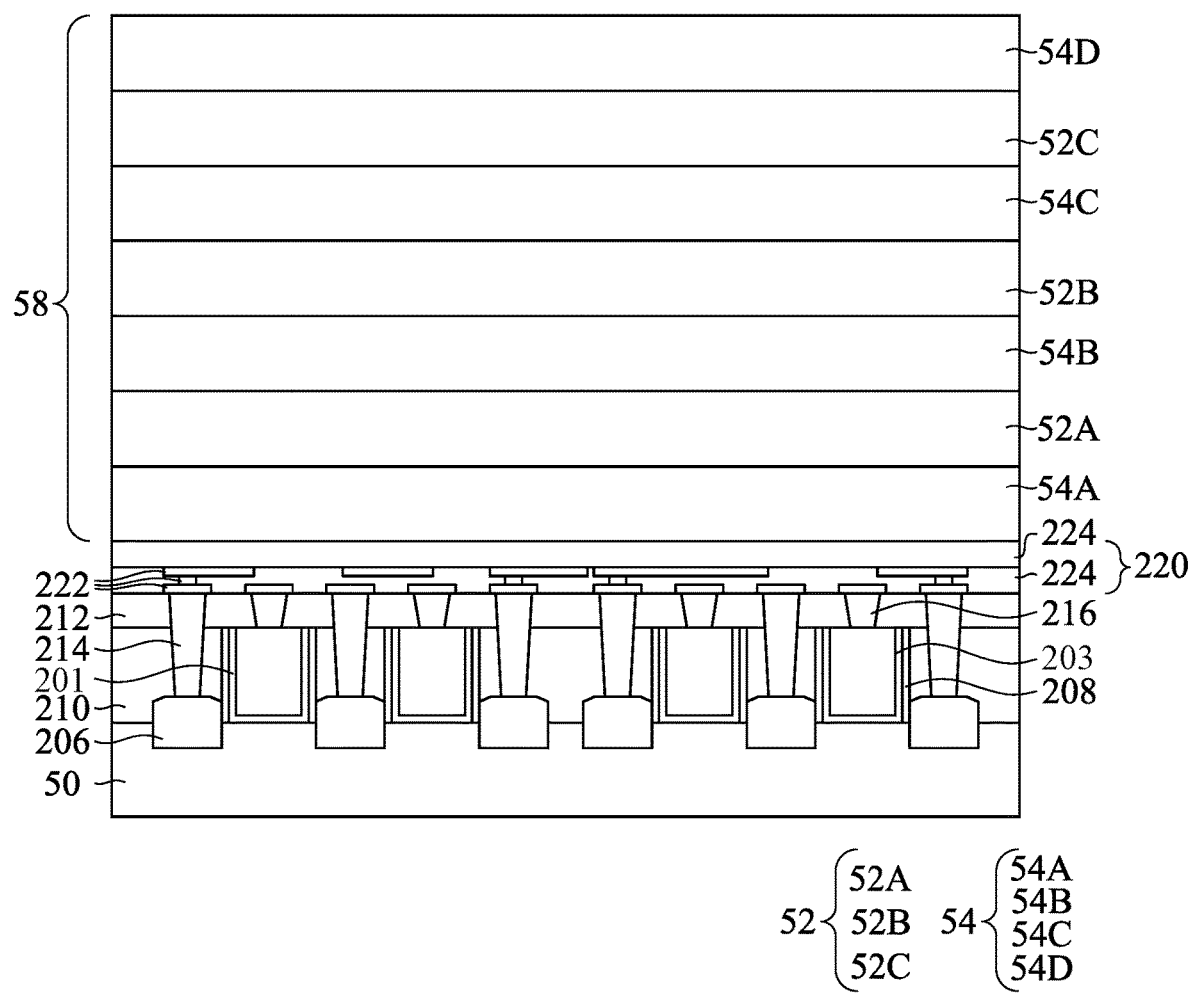

In FIGS. 3A and 3B, a multi-layer stack 58 is formed over the structure of FIG. 2. The substrate 50, the transistors, the ILDs, and the interconnect structure 220 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, one or more additional interconnect layers comprising conductive features in insulating layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B). Alternatively, the multi-layer stack 58 may be disposed directly on a substrate 50 without any intervening features. In such embodiments, the substrate 50 may be free of any active devices.

The multi-layer stack 58 includes alternating layers of conductive layers 54A-D (collectively referred to as conductive layers 54) and dielectric layers 52A-C (collectively referred to as dielectric layers 52). The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and/or dielectric layers 52.

Figure 10:
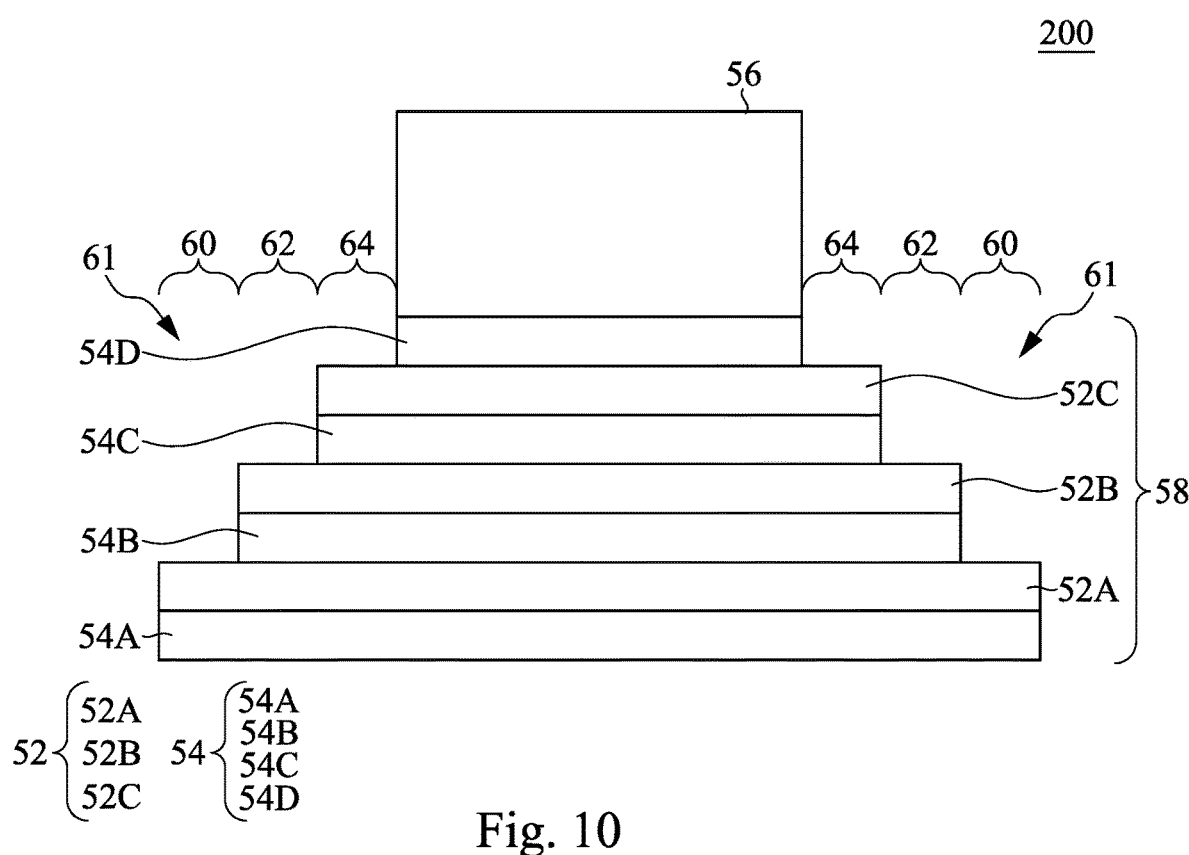
Figure 11:
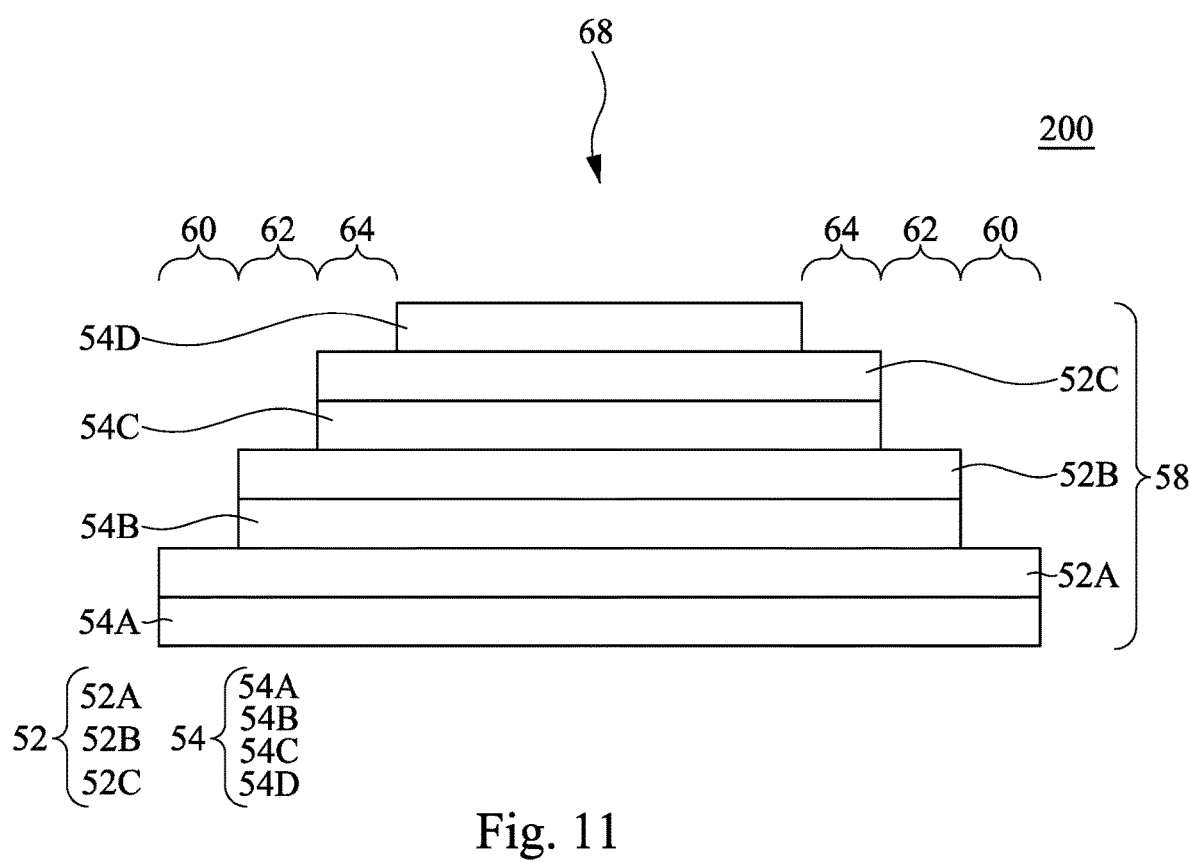
Figure 12A:
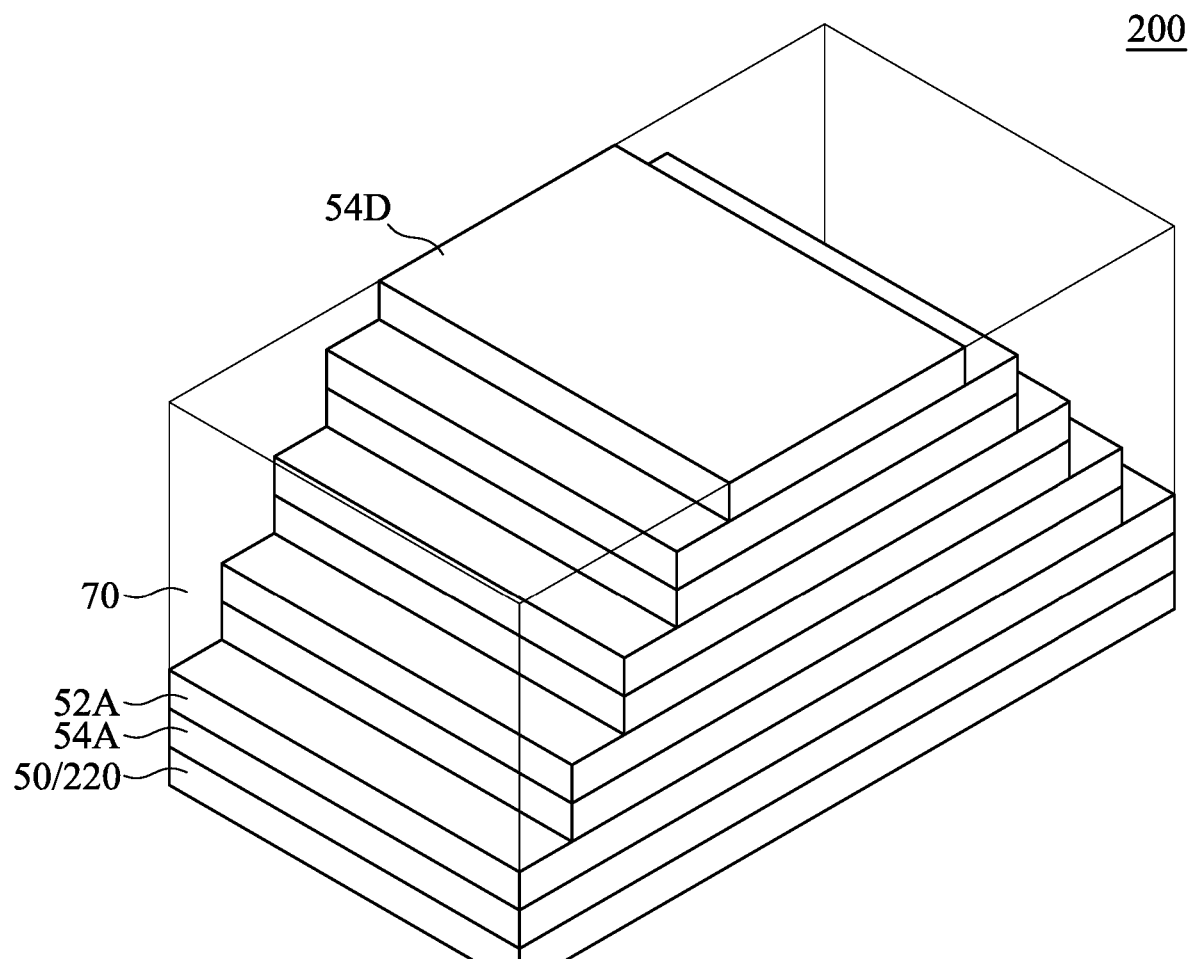

FIGS. 4-11, 12A and 12B are views of intermediate stages in the manufacturing a staircase structure of the memory array 200, in accordance with some embodiments. FIGS. 4 through 11 and 12B are illustrated along reference cross-section B-B' illustrated in FIG. 1. FIG. 12A is illustrated in a three-dimensional view.

Figure 4:
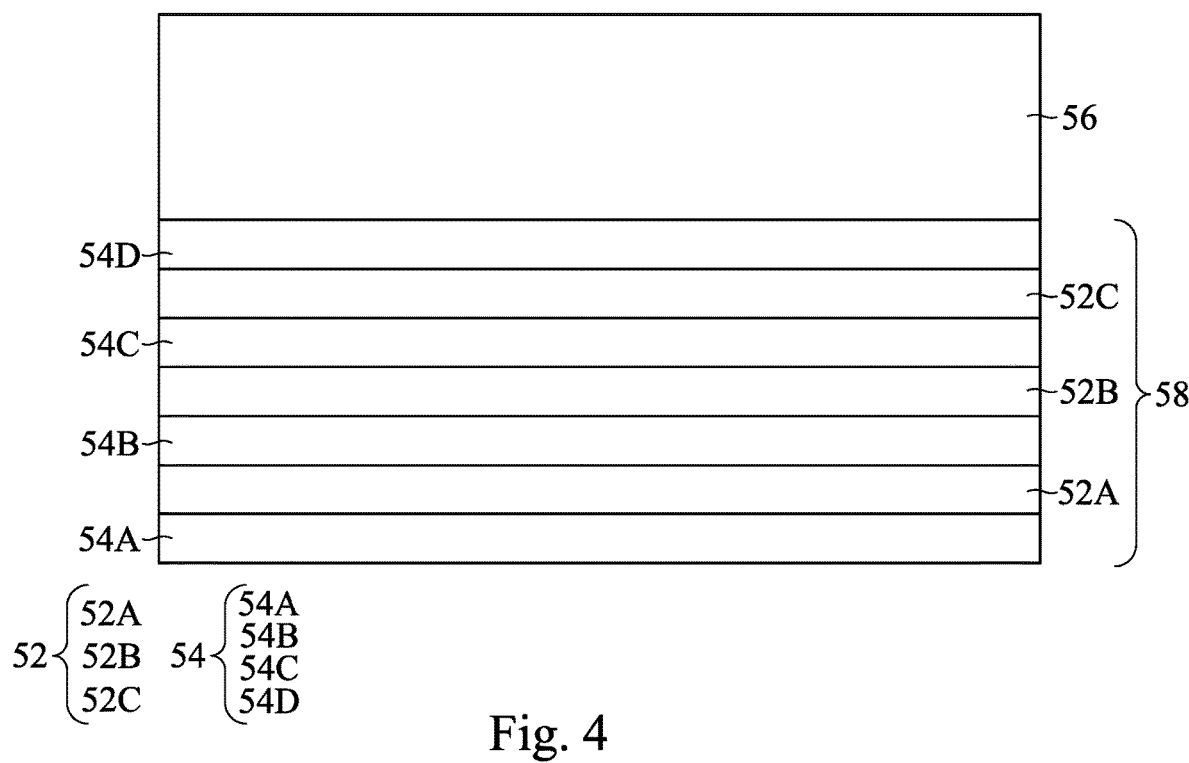

In FIG. 4, a photoresist 56 is formed over the multi-layer stack 58. As discussed above, the multi-layer stack 58 may comprise alternating layers of the conductive layers 54 (labeled 54A, 54B, 54C, and 54D) and the dielectric layers 52 (labeled 52A, 52B, and 52C). The photoresist 56 can be formed by using a spin-on technique.

Figure 5:
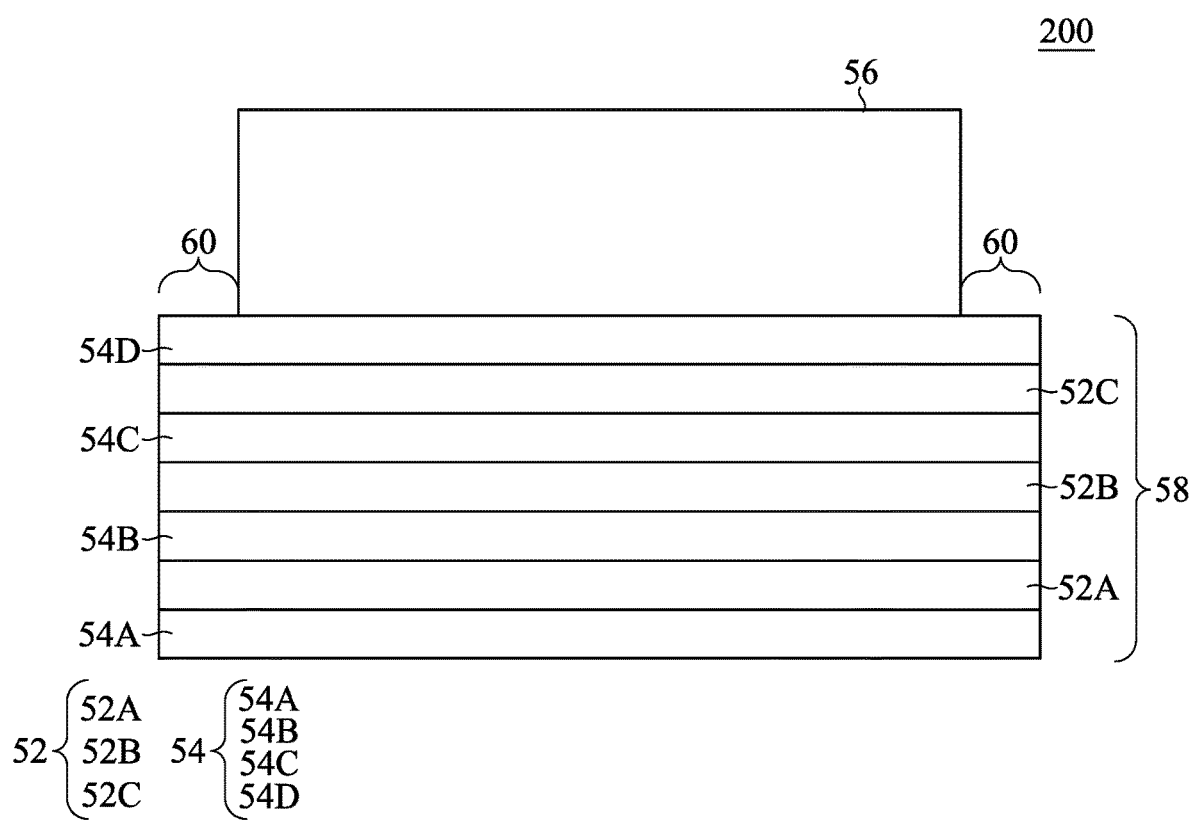
Figure 6:
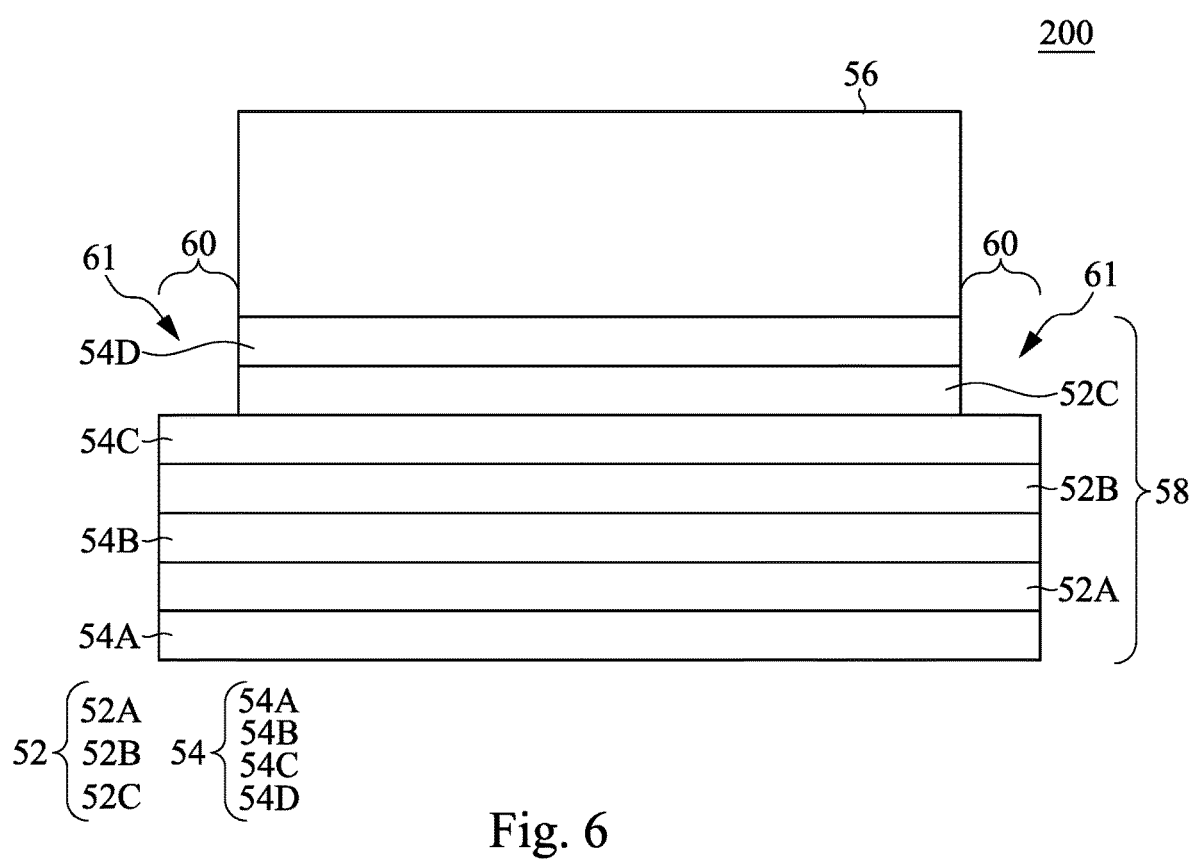

In FIG. 5, the photoresist 56 is patterned to expose the multi-layer stack 58 in regions 60 while masking remaining portions of the multi-layer stack 58. For example, a topmost layer of the multi-layer stack 58 (e.g., conductive layer 54D) may be exposed in the regions 60. The photoresist 56 may be patterned using acceptable photolithography techniques In FIG. 6, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the conductive layer 54D and dielectric layer 52C in the regions 60 and define openings 61. Because the conductive layer 54D and the dielectric layer 52C have different material compositions, etchants used to remove exposed portions of these layers may be different. In some embodiments, the dielectric layer 52C acts as an etch stop layer while etching the conductive layer 54D, and the conductive layer 54C acts as an etch stop layer while etching dielectric layer 52C. As a result, the portions of the dielectric layer 52C and the conductive layer 54D may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the conductive layer 54C is exposed in the regions 60.

Figure 7:
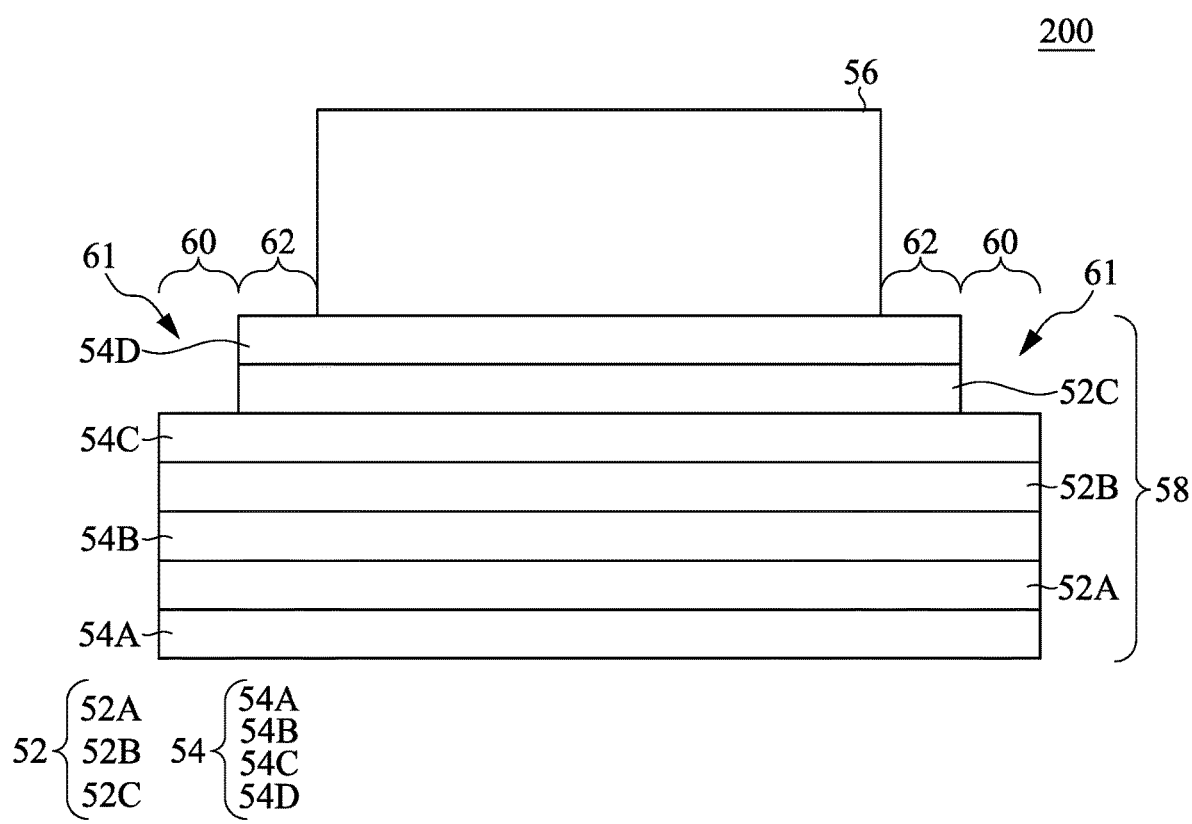

In FIG. 7, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 and 62 may be exposed. For example, a top surface of the conductive layer 54C may be exposed in the regions 60, and a top surface of the conductive layer 54D may be exposed in the regions 62.

Figure 8:
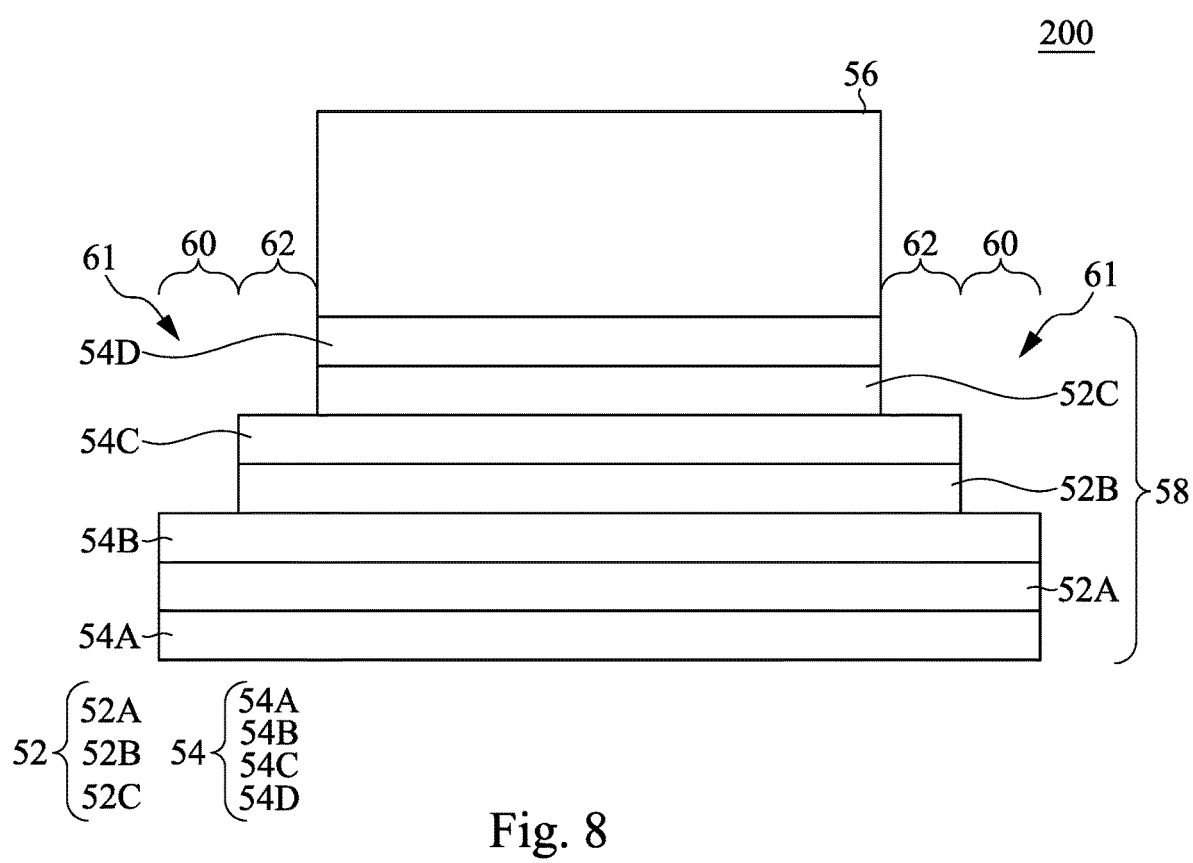

In FIG. 8, portions of the conductive layer 54D, the dielectric layer 52C, the conductive layer 54C, and the dielectric layer 52B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive layers 54D/54C and the dielectric layers 52C/52B have different material compositions, etchants used to remove exposed portions of these layers may be different. In some embodiments, the dielectric layer 52C acts as an etch stop layer while etching the conductive layer 54D; the conductive layer 54C acts as an etch stop layer while etching dielectric layer 52C; the dielectric layer 52B acts as an etch stop layer while etching the conductive layer 54C; and the conductive layer 54B acts as an etch stop layer while etching the dielectric layer 52B. As a result, portions of the conductive layers 54D/54C and the dielectric layer 52C/52B may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the conductive layer 54D and dielectric layer 52C (see FIG. 7) may be transferred to the underlying conductive layer 54C and dielectric layer 52B. In the resulting structure, the conductive layer 54B is exposed in the regions 60, and the conductive layer 54C is exposed in the regions 62.

Figure 9:
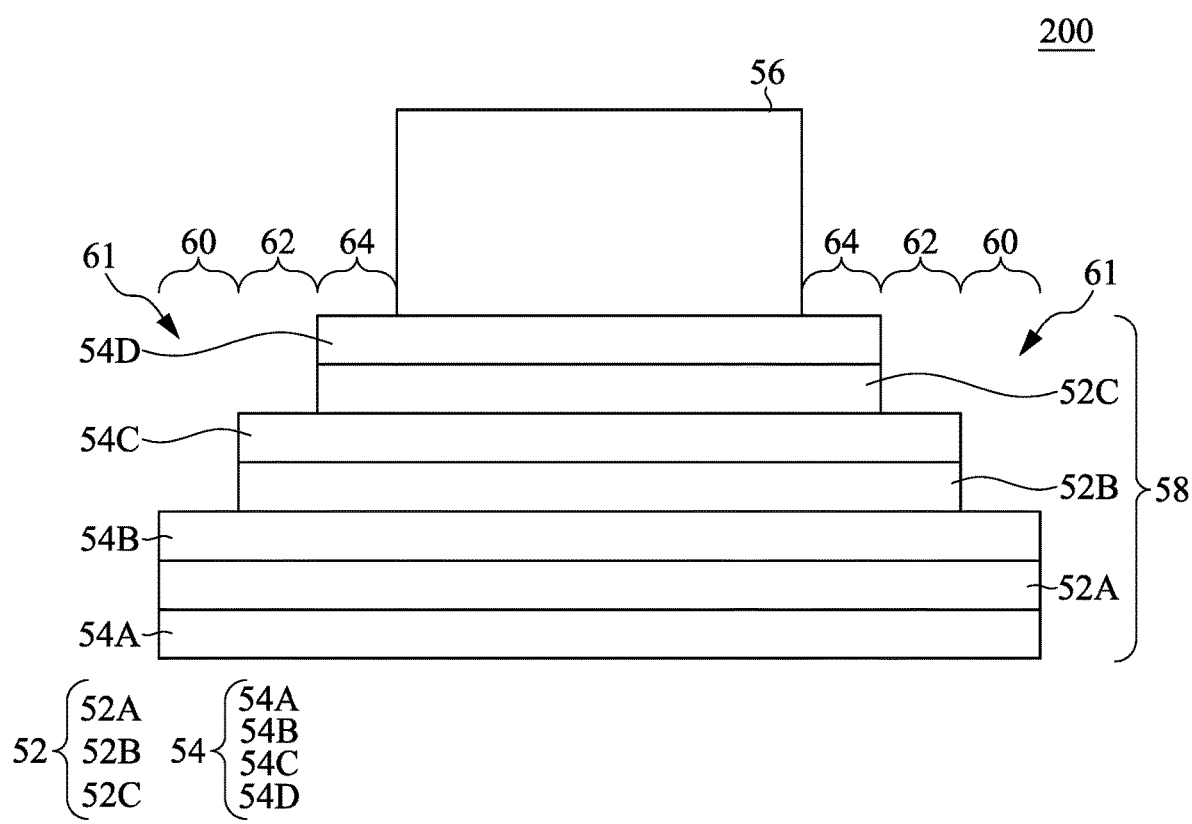

In FIG. 9, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60, 62, and 64 may be exposed. For example, a top surface of the conductive layer 54B may be exposed in the regions 60; a top surface of the conductive layer 54C may be exposed in the regions 62; and a top surface of the conductive layer 54D may be exposed in the regions 64.

In FIG. 10, portions of the conductive layers 54D, 54C, and 54B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the dielectric layer 52C acts as an etch stop layer while etching the conductive layer 54D; the dielectric layer 52B acts as an etch stop layer while etching the conductive layer 54C; and the dielectric layer 52A acts as an etch stop layer etching the conductive layer 54B. As a result, portions of the conductive layers 54D, 54C, and 54B may be selectively removed without removing remaining layers of the multi-layer stack 58, and the openings 61 may be extended to a desired depth. Further, during the etching processes, each of the dielectric layers 52 act as a mask for underlying layers, and as a result a previous pattern of the dielectric layers 52C/52B (see FIG. 9) may be transferred to the underlying conductive layers 54C/54B. In the resulting structure, the dielectric layer 52A is exposed in the regions 60; the dielectric layer 52B is exposed in the regions 62; and the dielectric layer 52C is exposed in the regions 64.

In FIG. 11, the photoresist 56 may be removed, such as by an acceptable ashing or wet strip process. Thus, a staircase structure 68 is formed. The staircase structure comprises a stack of alternating ones of the conductive layers 54 and the dielectric layers 52. Lower conductive layers 54 are wider and extend laterally past upper conductive layers 54, and a width of each of the conductive layers 54 increases in a direction towards the substrate 50. For example, the conductive layer 54A may longer than the conductive layer 54B; the conductive layer 54B may be longer than the conductive layer 54C; and the conductive layer 54C may be longer than the conductive layer 54D. As a result, conductive contacts can be made from above the staircase structure 68 to each of the conductive layers 54 in subsequent processing steps.

In FIG. 12A, an inter-metal dielectric (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the conductive layers 54 as well as sidewalls of the dielectric layers 52. Further, the IMD 70 may contact top surfaces of each of the dielectric layers 52.

Figure 12B:
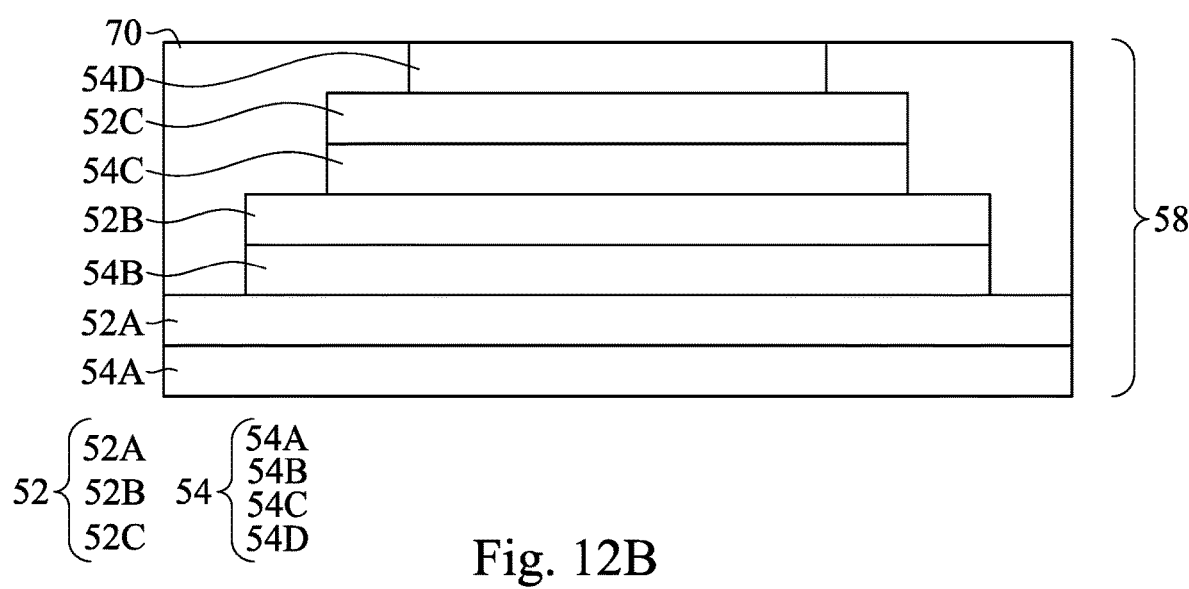

As further illustrated in FIG. 12B, a removal process is then applied to the IMD 70 to remove excess dielectric material over the multi-layer stack 58. In some embodiments, a planarization process such as a chemical mechanical polish (CMP), an etch-back process, combinations thereof, or the like may be utilized. The planarization process exposes the multi-layer stack 58 such that top surfaces of the multi-layer stack 58 and IMD 70 are level after the planarization process is complete.

Figure 15:
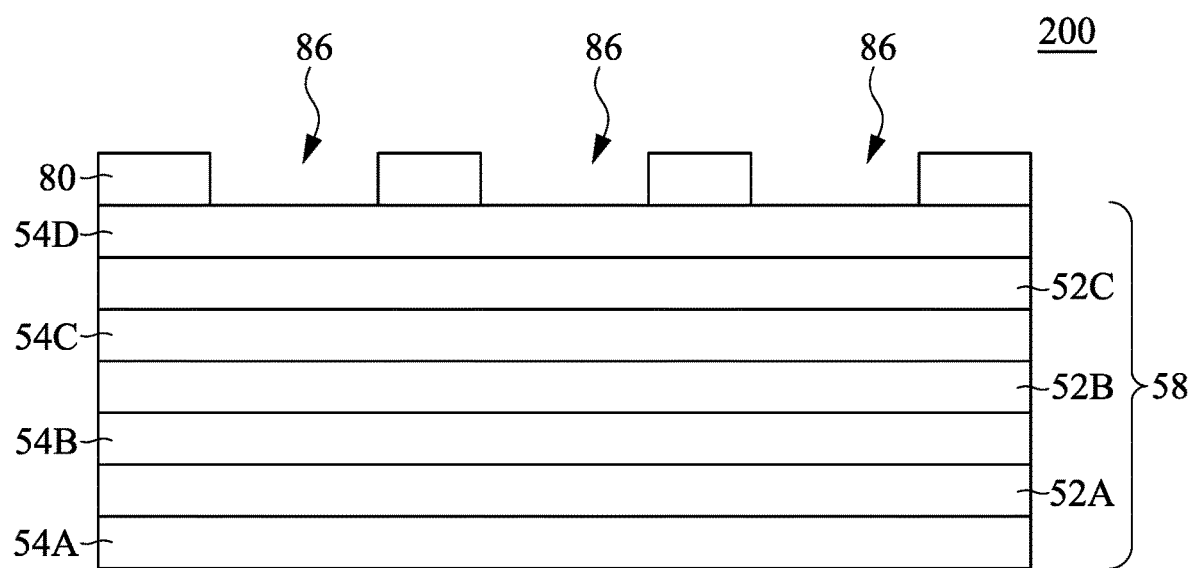
Figure 16:
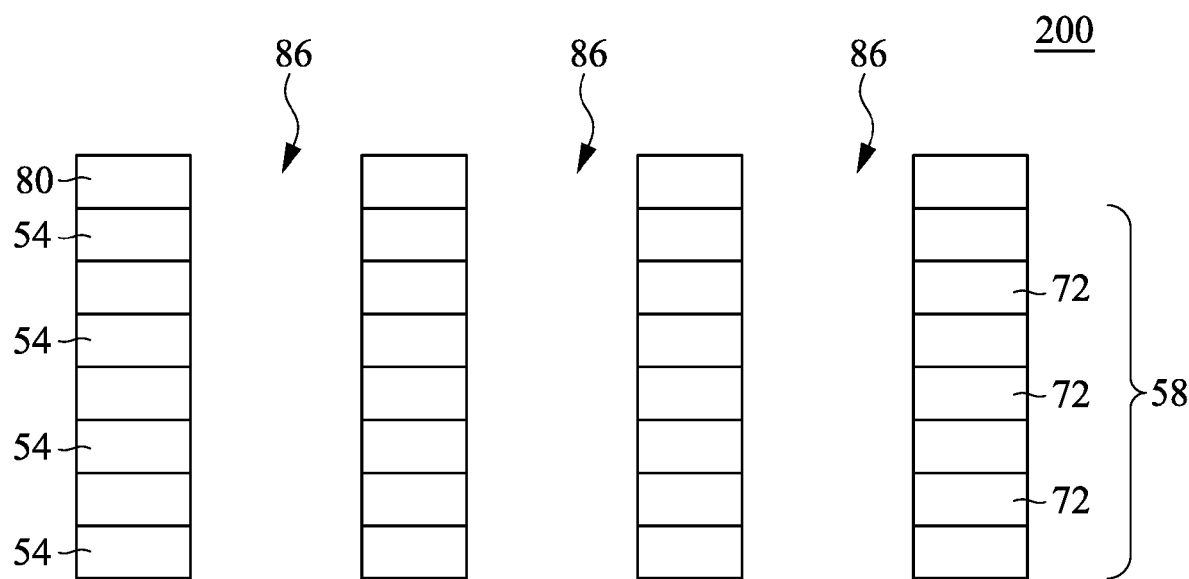
Figure 17A:
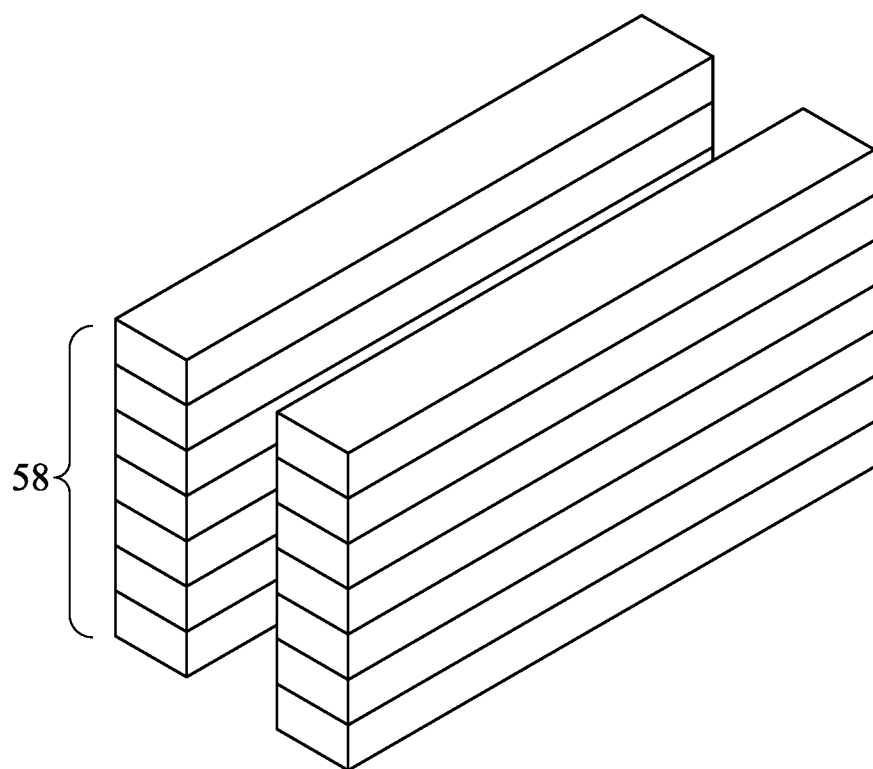
Figure 17B:
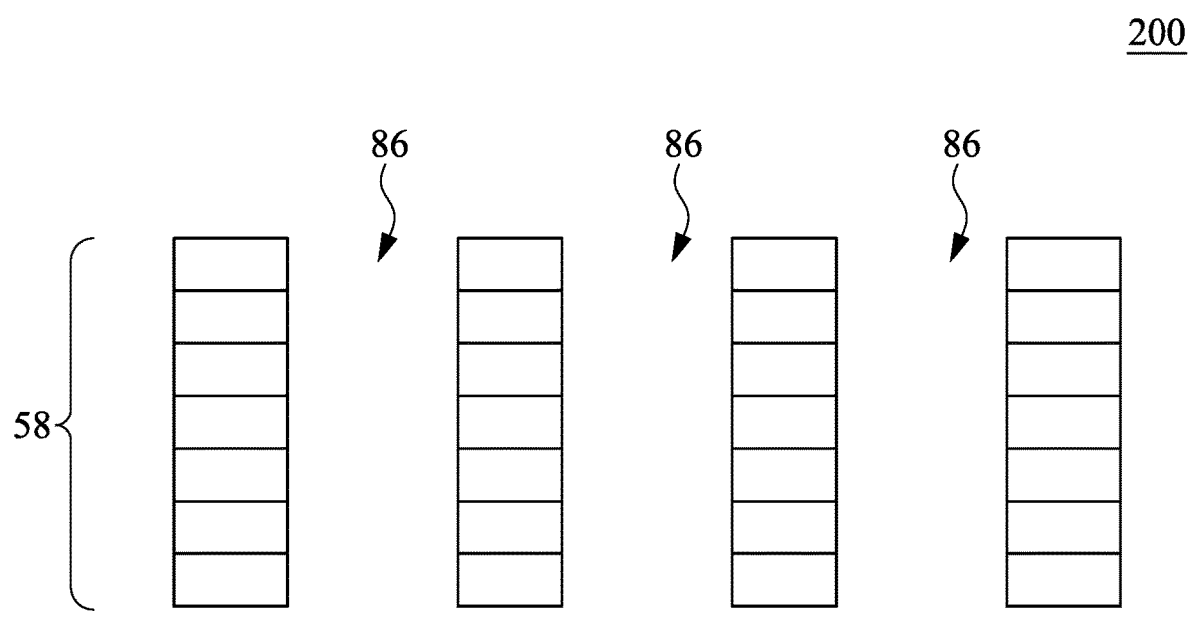

FIGS. 13-16, 17A and 17B are views of intermediate stages in the manufacturing of the memory array 200, in accordance with some embodiments. In FIGS. 13-16, 17A and 17B, trenches are patterned in the multi-layer stack 58, thereby defining the conductive lines 72. The conductive lines 72 may correspond to word lines in the memory array 200, and the conductive lines 72 may further provide gate electrodes for the resulting TFTs of the memory array 200. FIG. 17A is illustrated in a three-dimensional view. FIGS. 13 through 16 and 17B are illustrated along reference cross-section C-C' illustrated in FIG. 1A.

Figure 13:
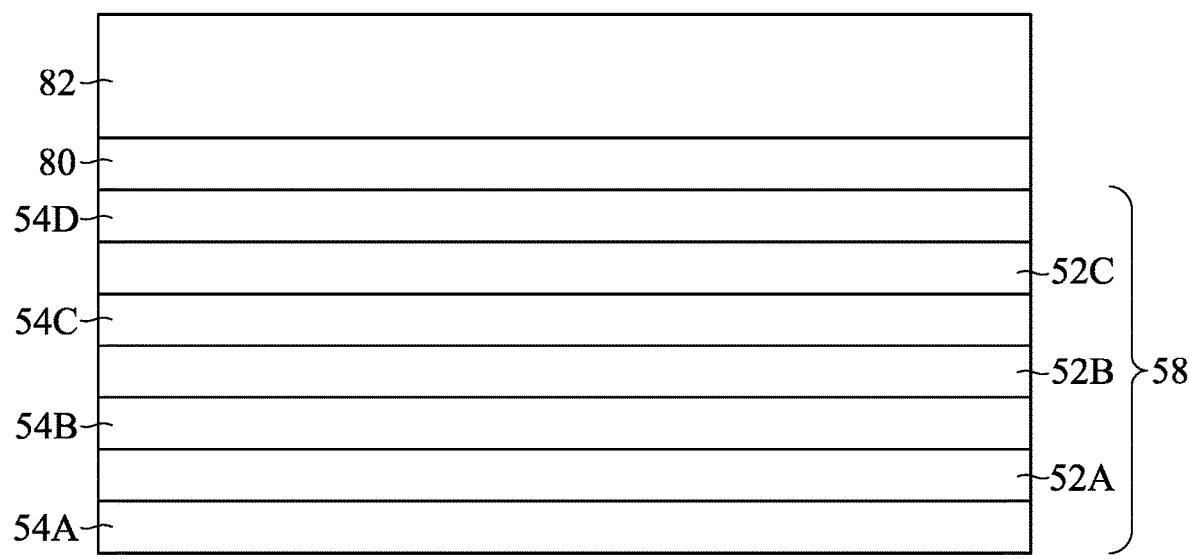

In FIG. 13, a hard mask 80 and a photoresist 82 are deposited over the multi-layer stack 58. The hard mask layer 80 may include, for example, silicon nitride, silicon oxynitride, or the like, which may be deposited by CVD, PVD, ALD, PECVD, or the like. The photoresist 82 can be formed by using a spin-on technique, for example.

Figure 14:
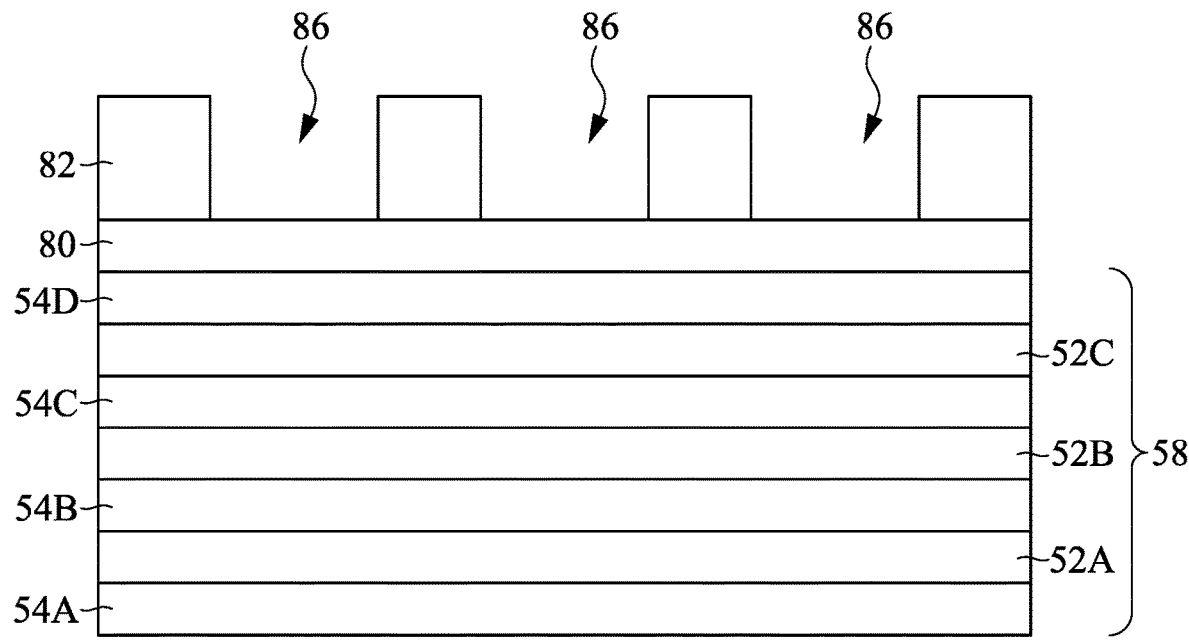

In FIG. 14, the photoresist 82 is patterned to form trenches 86. The photoresists can be patterned using acceptable photolithography techniques. For example, the photoresist 82 be exposed to light for patterning. After the exposure process, the photoresist 82 may be developed to remove exposed or unexposed portions of the photo resist depending on whether a negative or positive resist is used, thereby defining a patterning of the form trenches 86.

In FIG. 15, a pattern of the photoresist 82 is transferred to the hard mask 80 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 80. The photoresist 82 may be removed by an ashing process, for example.

In FIG. 16, a pattern of the hard mask 80 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other. Subsequently, in FIGS. 17A and 17B, the hard mask 80 may then be removed by an acceptable process, such as a wet etching process, a dry etching process, a planarization process, combinations thereof, or the like. Due to the staircase shape of the multi-layered stack 58 (see e.g., FIG. 12), the conductive lines 72 may have varying lengths that increase in a direction towards the substrate 50. For example, the conductive lines 72A may be longer than the conductive lines 72B; the conductive lines 72B may be longer than the conductive lines 72C; and the conductive lines 72C may be longer than the conductive lines 72D.

Figure 18A:
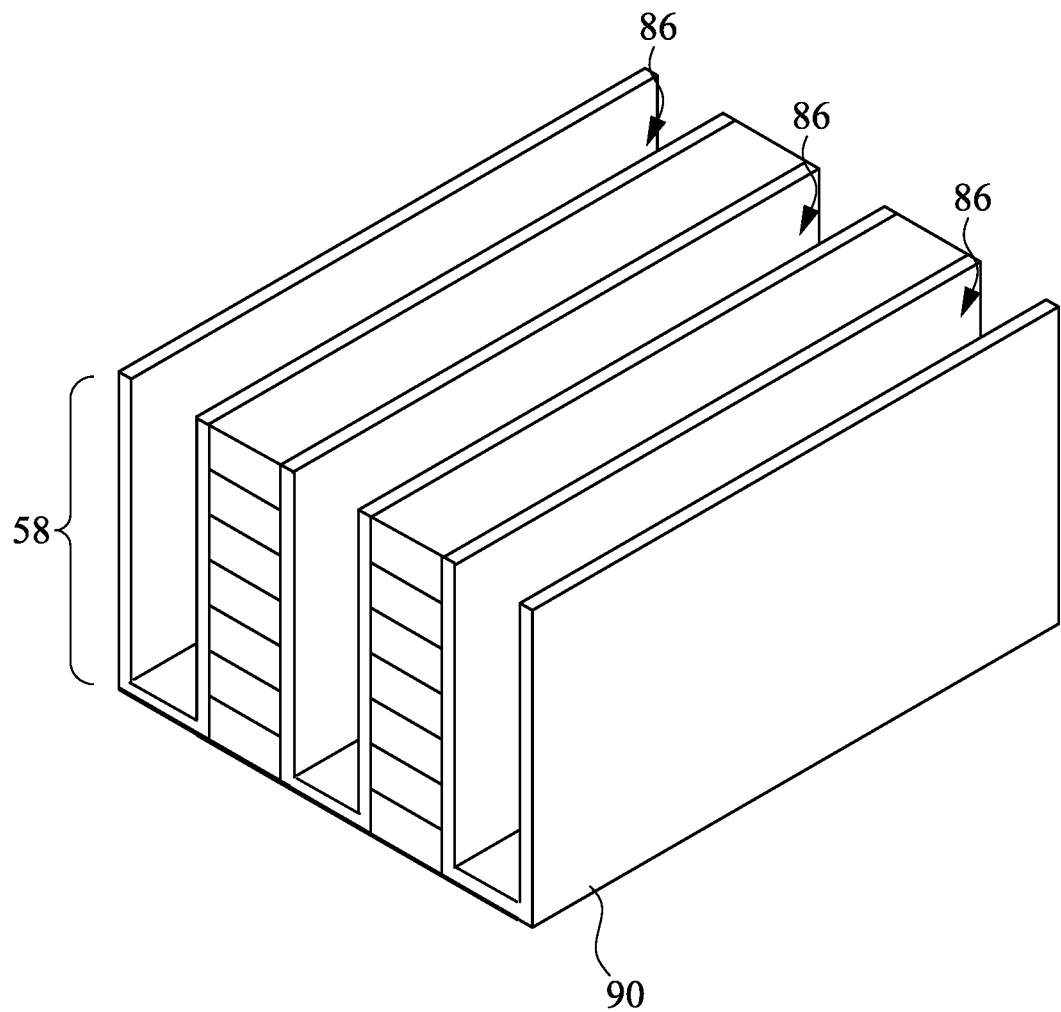
Figure 18B:
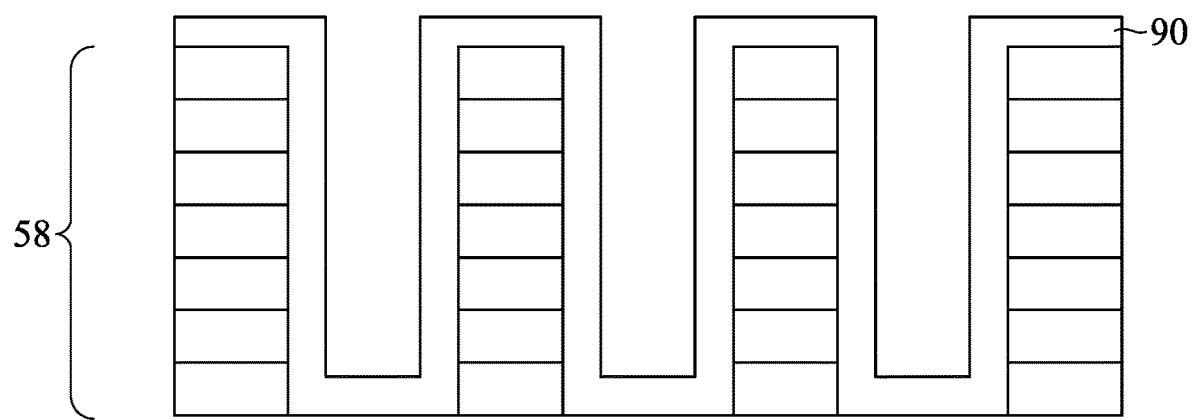
Figure 19A:
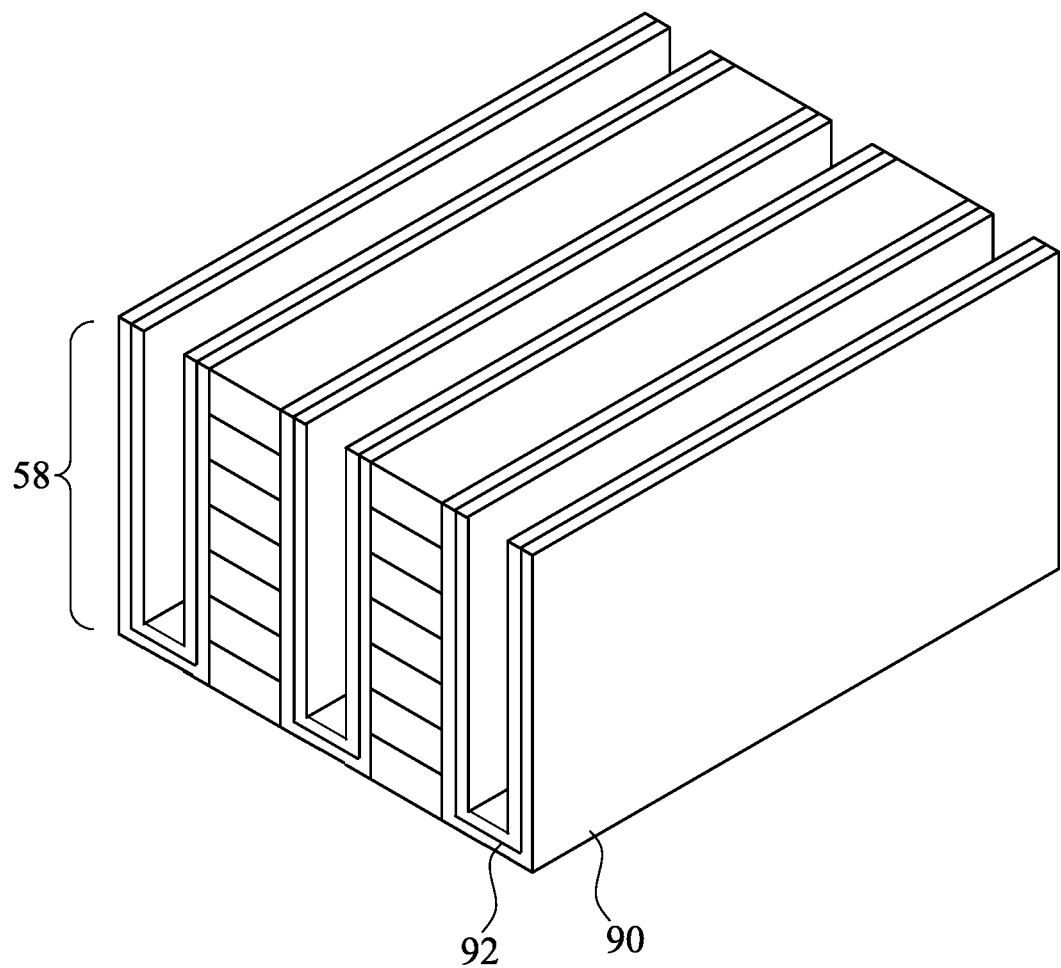
Figure 21:
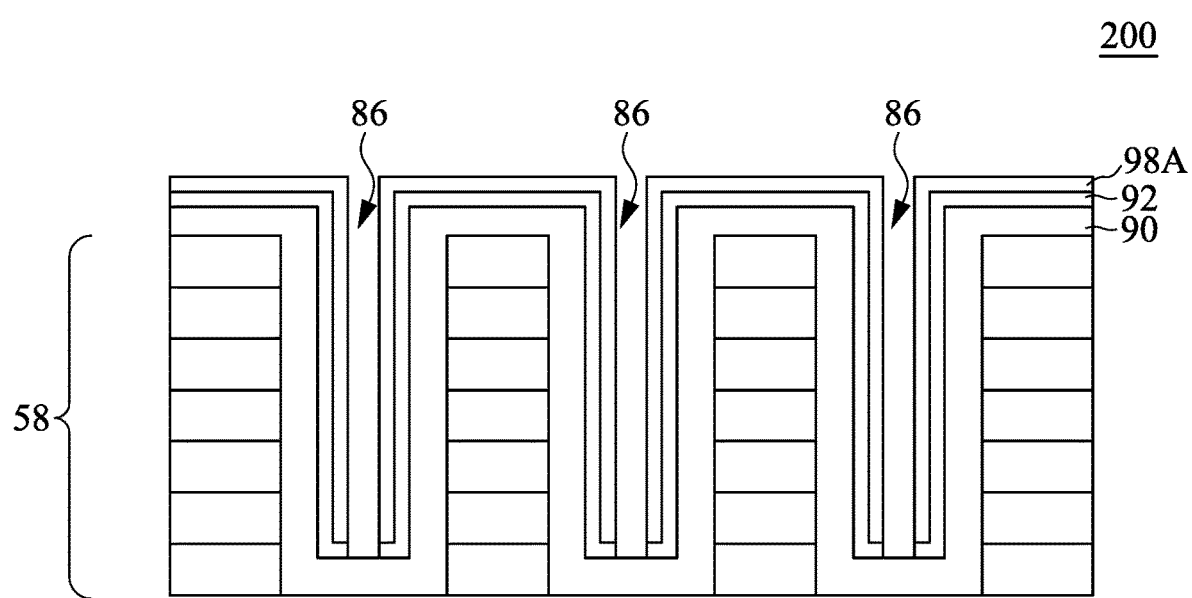
Figure 22:
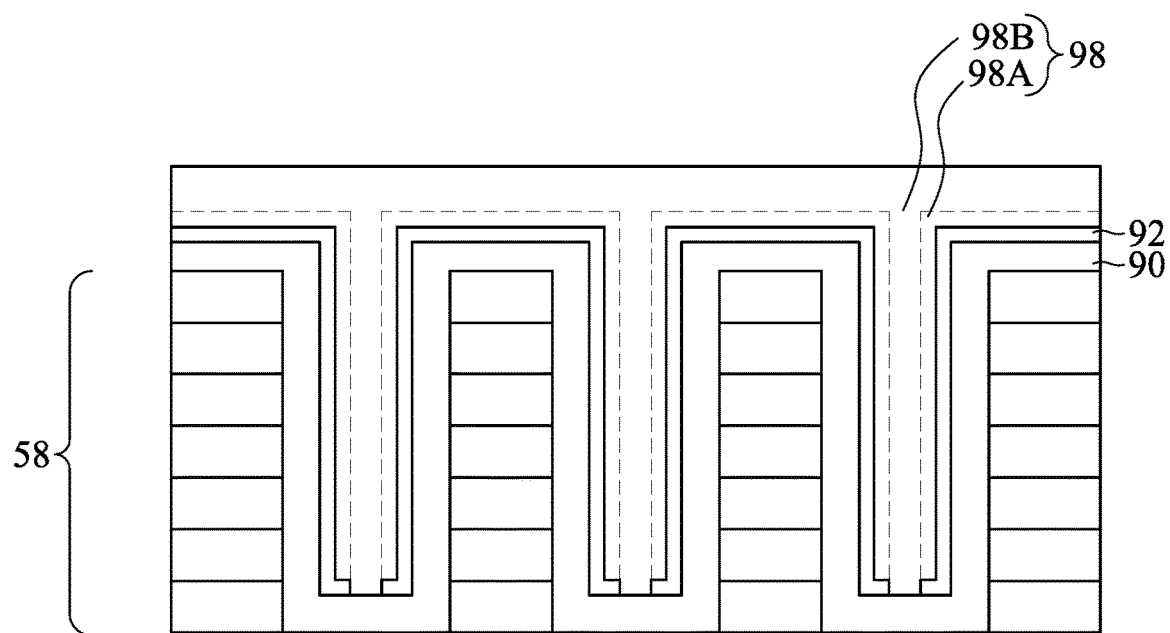
Figure 23A:
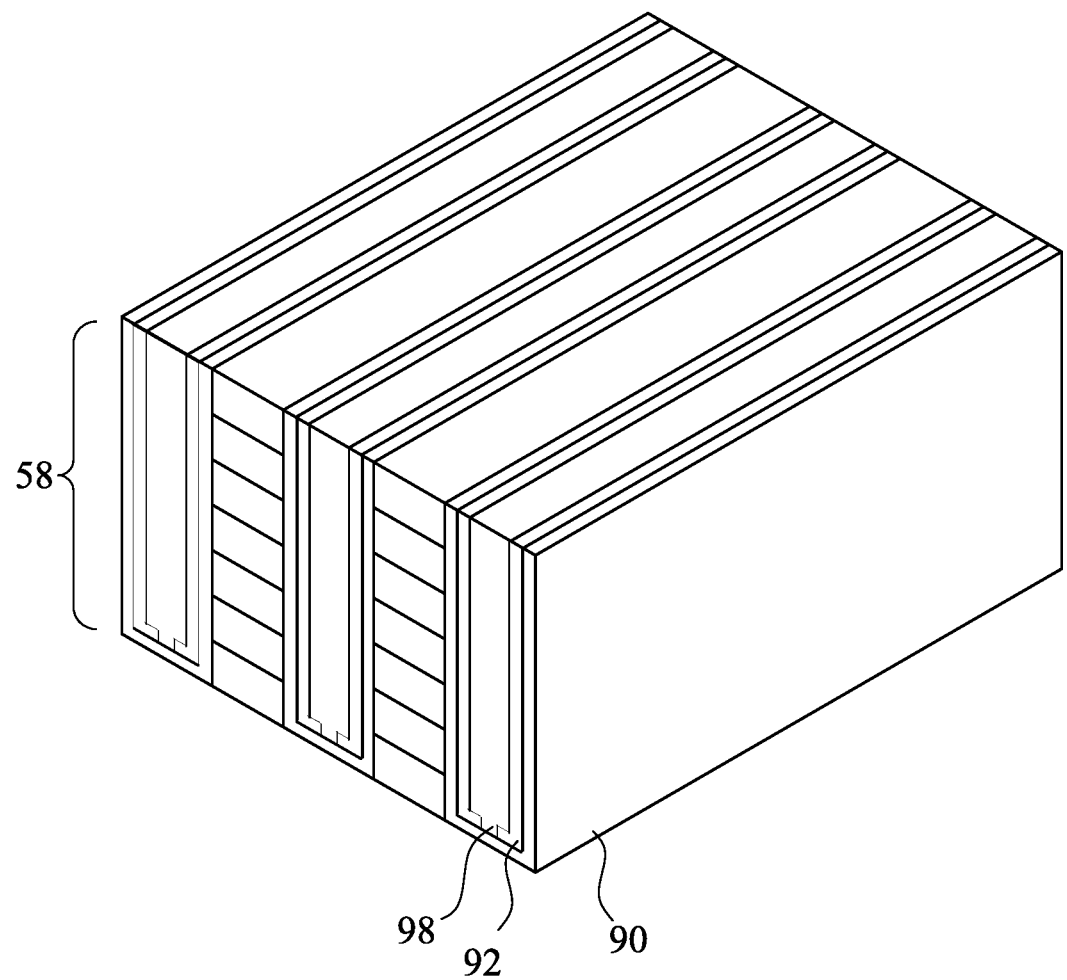
Figure 23B:
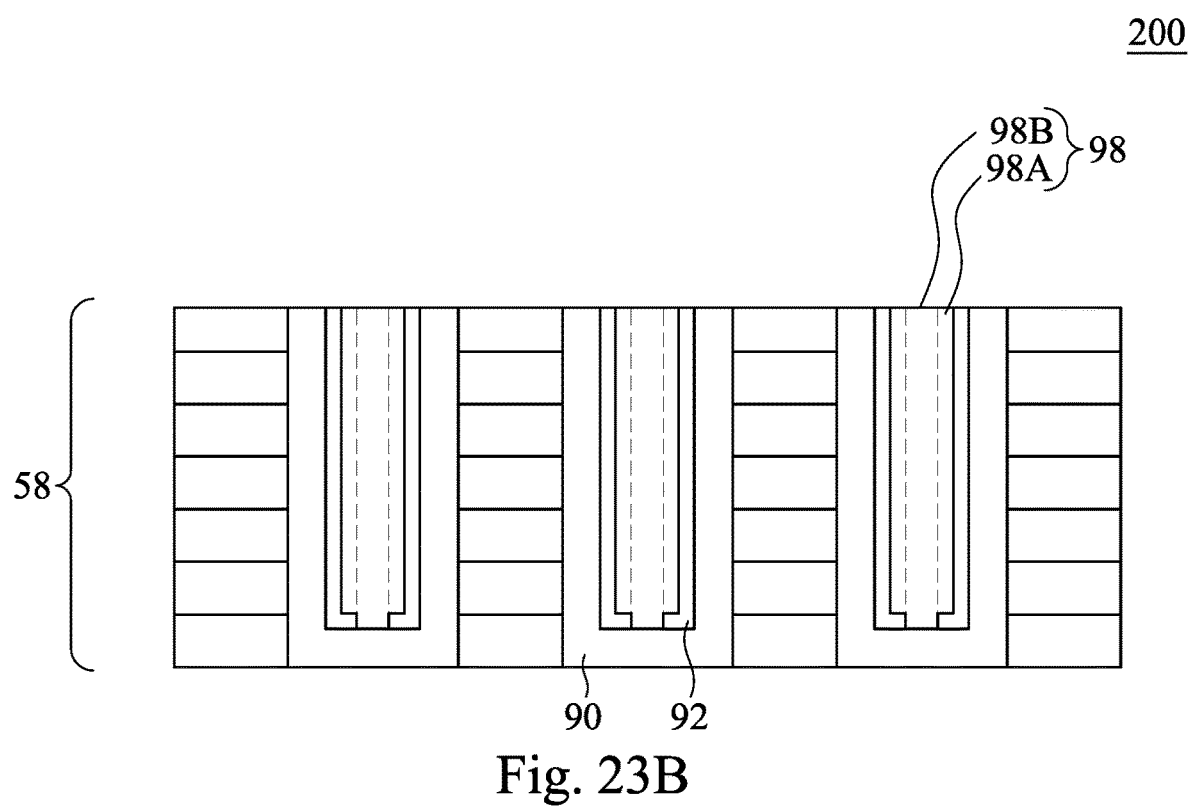
Figure 23C:
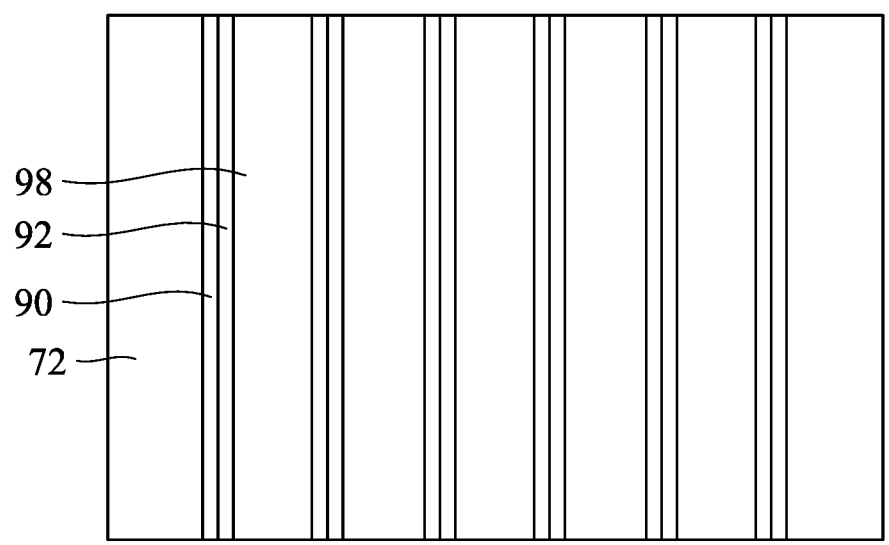

FIGS. 18A, 18B, 19A, 19B, 20-22 and 23A-23C illustrate forming and patterning channel regions for the TFTs 204 (see FIG. 1A) in the trenches 86. FIGS. 18A, 19A, and 23A are illustrated in a three-dimensional view. In FIGS. 18B, 19B, 20, 21, 22, and 23B cross-sectional views are provided along line C-C' of FIG. 1A. FIG. 23C illustrates a corresponding top-down view of the TFT structure.

In FIGS. 18A and 18B, a memory film 90 is conformally deposited in the trenches 86. The memory film 90 may have a material that is capable of storing a bit, such as material capable of switching between two different polarization directions by applying an appropriate voltage differential across the memory film 90. For example, the polarization of the memory film 90 may change due to an electric field resulting from applying the voltage differential.

For example, the memory film 90 may be a high-k dielectric material, such as a hafnium (Hf) based dielectric material, or the like. In some embodiments, the memory film 90 comprises a ferroelectric material (such as, hafnium oxide, hafnium zirconium oxide, silicon-doped hafnium oxide, or the like), silicon oxynitride, silicon nitride, or the like. In other embodiments, the memory film 90 may be a multilayer structure comprising a layer of $SiN_x$ between two $SiO_x$ layers (e.g., an ONO structure) or a layer of $SiO_x$ between two $SiN_x$ layers (e.g., a NON structure). In still other embodiments, the memory film 90 may comprise a different ferroelectric material or a different type of memory material. The memory film 90 may be deposited by CVD, PVD, ALD, PECVD, or the like to extend along sidewalls and a bottom surface of the trenches 86. After the memory film 90 is deposited, an annealing step (e.g., at a temperature range of about 300° C. to about 600° C.) may be performed to achieve a desired crystalline phase, improve film quality, and reduce film-related defects/impurities for the memory film 90. In some embodiments, the annealing step may further be below 400° C. to meet a BEOL thermal budget and reduce defects that may result in other features from high-temperature annealing processes.

Figure 19B:
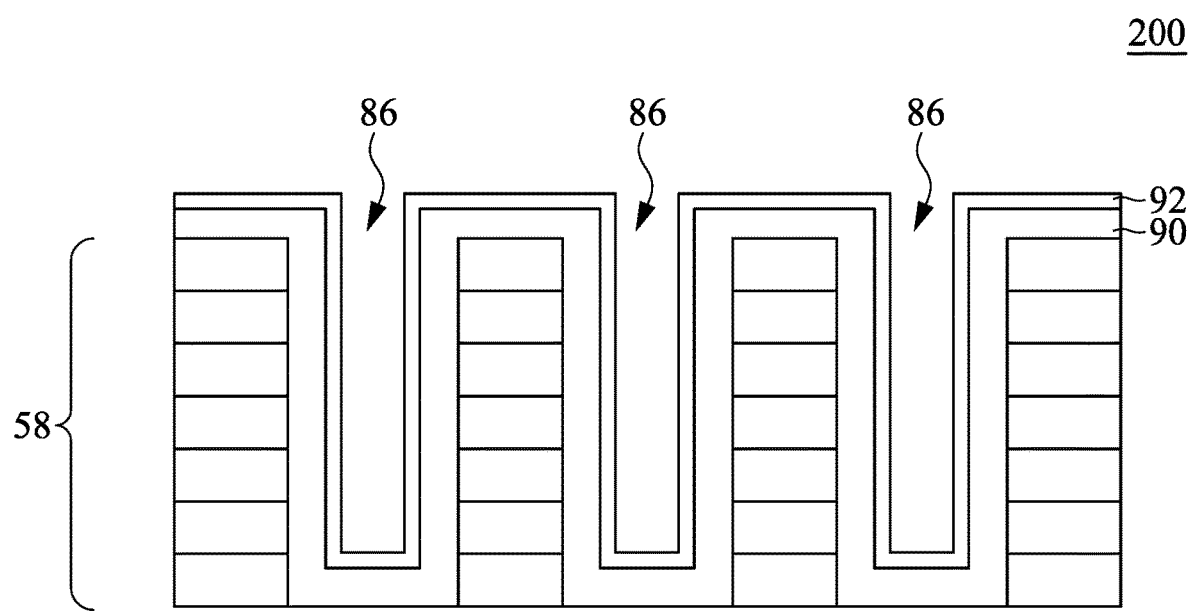

In FIGS. 19A and 19B, the OS layer 92 is conformally deposited in the trenches 86 over the memory film 90. The OS layer 92 comprises a material suitable for providing a channel region for a TFT (e.g., TFTs 204, see FIG. 1A). In some embodiments, the OS layer 92 comprises an indium-comprising material, such as $In_xGa_yZn_zMO$, where M may be Ti, Al, Ag, Si, Sn, or the like. X, Y, and Z may each be any value between 0 and 1. In other embodiments, a different oxide semiconductor material, such as, indium tungsten oxide (IWO), zinc oxide, or the like may be used for the OS layer 92. In still other embodiments, the OS layer 92 may be replaced with a polysilicon or other semiconductor material. The OS layer 92 may be deposited by CVD, PVD, ALD, PECVD, or the like. The OS layer 92 may extend along sidewalls and a bottom surface of the trenches 86 over the FE layer 90. After the OS layer 92 is deposited, an annealing step (e.g., at a temperature range of about 300° C. to about 450° C. or in a range of about 300° C. to about 400° C.) in oxygen-related ambient may be performed to activate the charge carriers of the OS layer 92.

Figure 20:
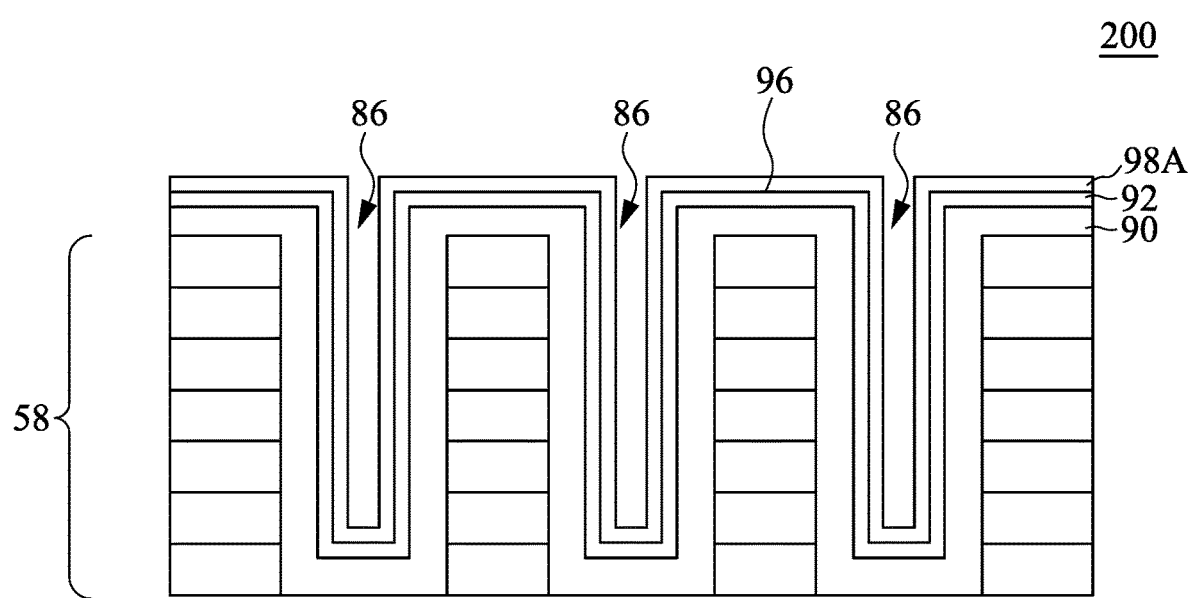

In FIG. 20, a dielectric material 98A is deposited on sidewalls and a bottom surface of the trenches 86 and over the OS layer 92. The dielectric material 98A may comprise, for example, silicon oxide, silicon nitride, silicon oxynitride, or the like, which may be deposited by CVD, PVD, ALD, PECVD, or the like.

In FIG. 21, bottom portions of the dielectric material 98A in the trenches 86 are removed using a combination of photolithography and etching, for example. The etching may be any acceptable etch process, such as by wet or dry etching, a reactive ion etch (RIE), neutral beam etch (NBE), the like, or a combination thereof. The etching may be anisotropic.

Subsequently, as also illustrated by FIG. 21, the dielectric material 98A may be used as an etch mask to etch through a bottom portion of the OS layer 92 in the trenches 86. The etching may be any acceptable etch process, such as by wet or dry etching, a reactive ion etch (RIE), neutral beam etch (NBE), the like, or a combination thereof. The etching may be anisotropic. Etching the OS layer 92 may expose portions of the memory film 90 on a bottom surface of the trenches 86. Thus, portions of the OS layer 92 on opposing sidewalls of the trenches 86 may be separated from each other, which improves isolation between the memory cells 202 of the memory array 200 (see FIG. 1A).

In FIG. 22, an additional dielectric material 98B is deposited to fill the trenches 86. The dielectric material 98B may have a same material composition and formed by a same process as the dielectric material 98A. The dielectric material 98B and the dielectric material 98A may be referred to collectively as the dielectric material 98 herein after.

In FIGS. 23A through 23C, a removal process is then applied to the dielectric material 98, the OS layer 92, and the memory film 90 to remove excess material over the multi-layer stack 58. In some embodiments, a planarization process such as a chemical mechanical polish (CMP), an etch-back process, combinations thereof, or the like may be utilized. The planarization process exposes the multi-layer stack 58 such that top surface of the multi-layer stack 58 is level after the planarization process is complete. FIG. 23C illustrates a corresponding top-down view of the structure illustrated in FIG. 23A.

FIGS. 24A through 27C illustrate intermediate steps of manufacturing conductive lines 106 and 108 (e.g., source lines and bit lines) in the memory array 200. The conductive lines 106 and 108 may extend along a direction perpendicular to the conductive lines 72 such that individual cells of the memory array 200 may be selected for read and write operations. In FIGS. 24A through 27C, figures ending in "A" illustrate a 3D view; figures ending in "B" illustrate a top down view, and figures ending in "C" illustrate a corresponding cross-sectional view parallel to line C-C' of FIG. 1A.

Figure 24A:
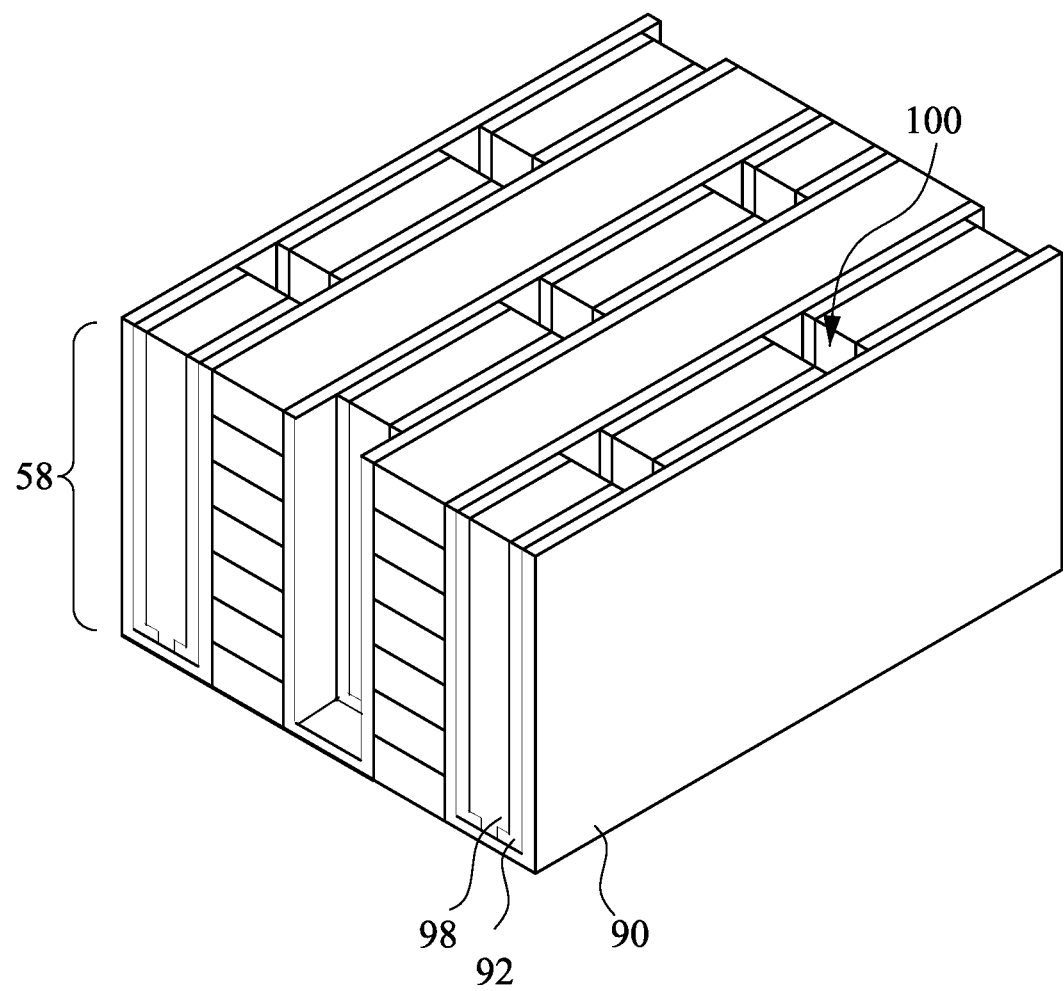
Figure 24B:
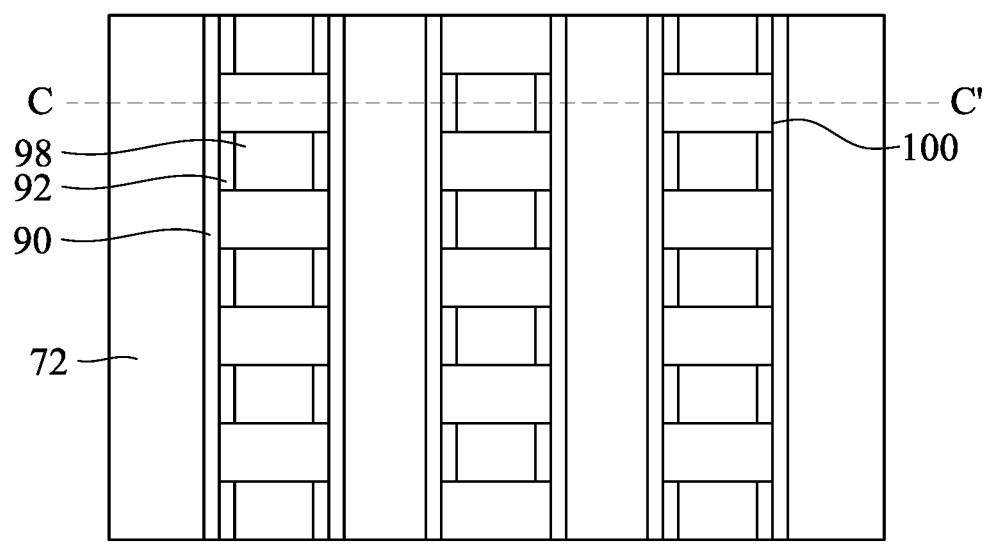
Figure 24C:
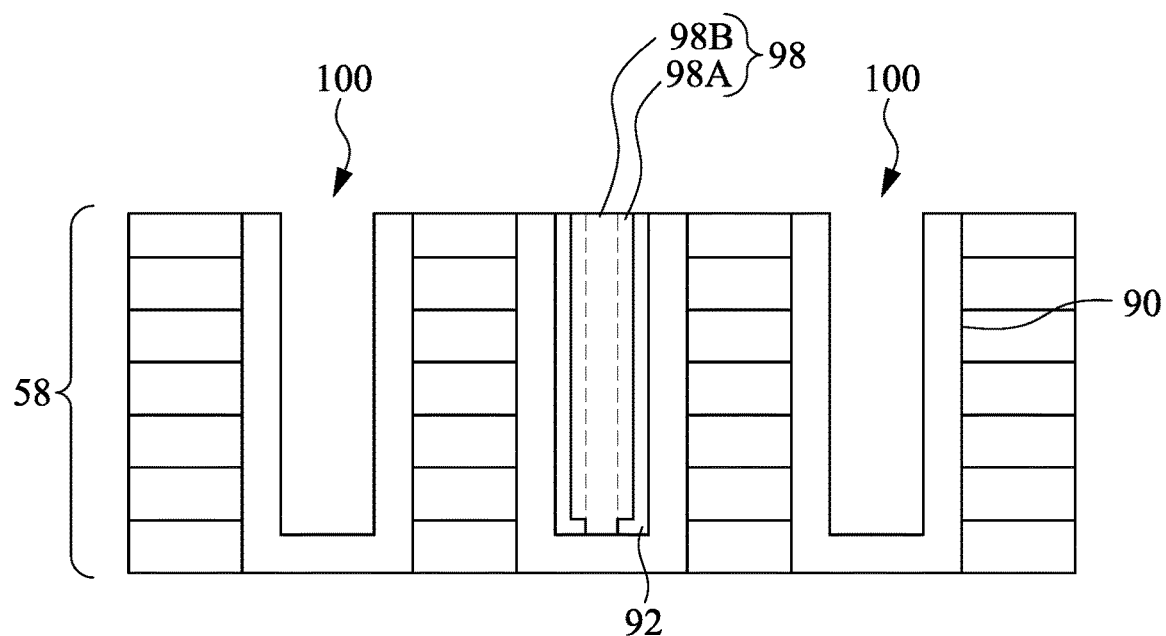

In FIGS. 24A, 24B, and 24C, trenches 100 are patterned through the OS layer 92 and the dielectric material 98. FIG. 24C illustrates a cross-section view of line C-C' in FIG. 24B. Patterning the trenches 100 may be performed through a combination of photolithography and etching, for example. The trenches 100 may be disposed between opposing sidewalls of the memory film 90, and the trenches 100 may physically separate adjacent stacks of memory cells in the memory array 200 (see FIG. 1A). The trenches 100 may be patterned such that trenches 100 in adjacent columns are staggered for each other. By staggering locations of the trenches 100, isolation in the resulting memory array 200 can be improved.

Figure 25A:
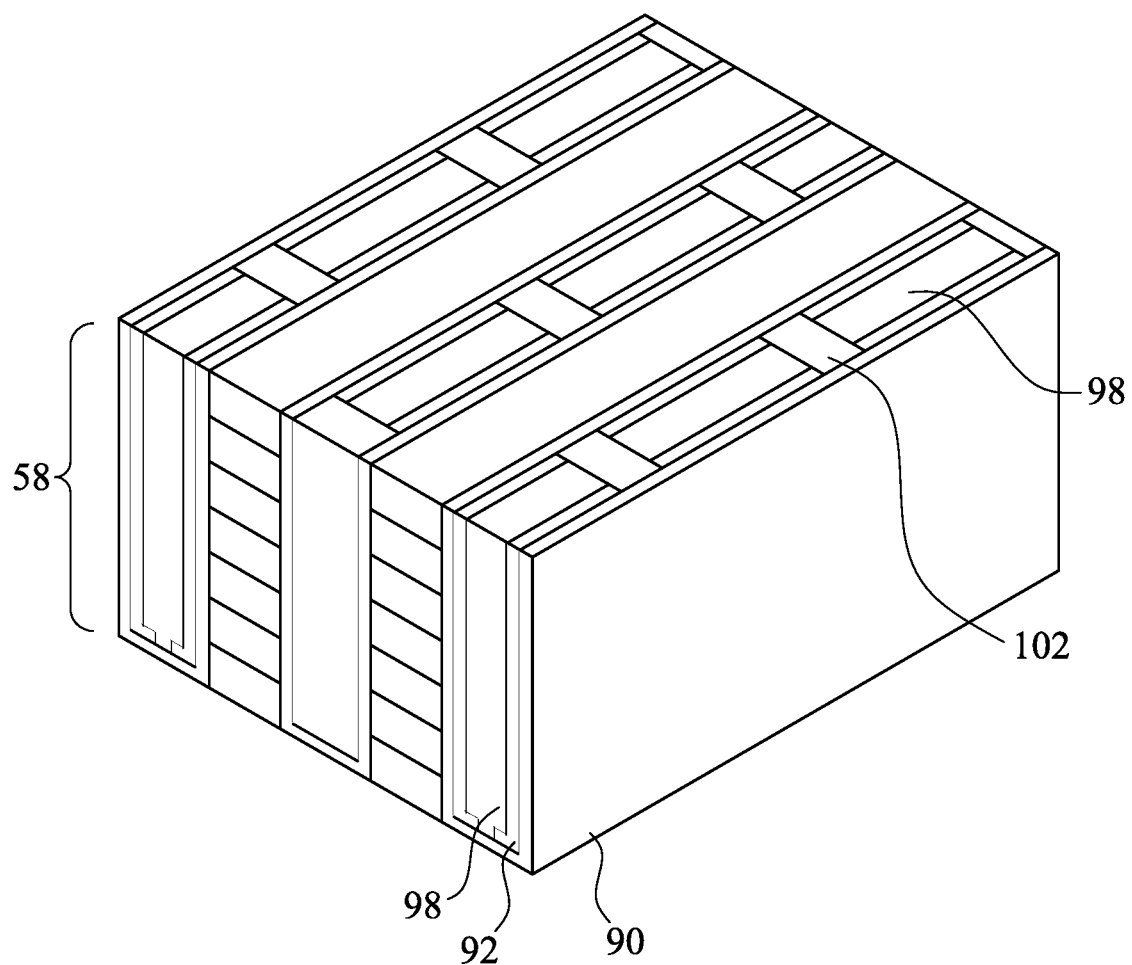
Figure 25B:
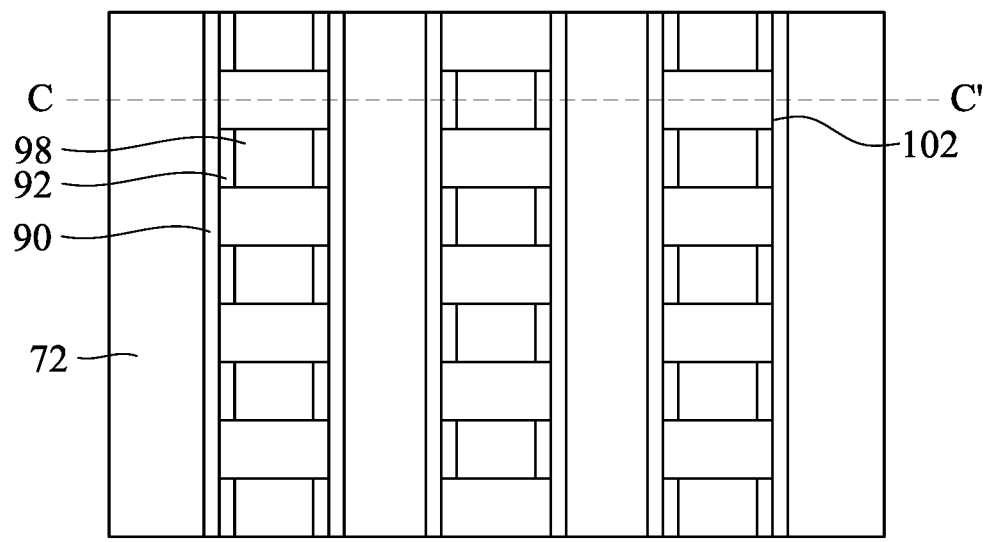
Figure 25C:
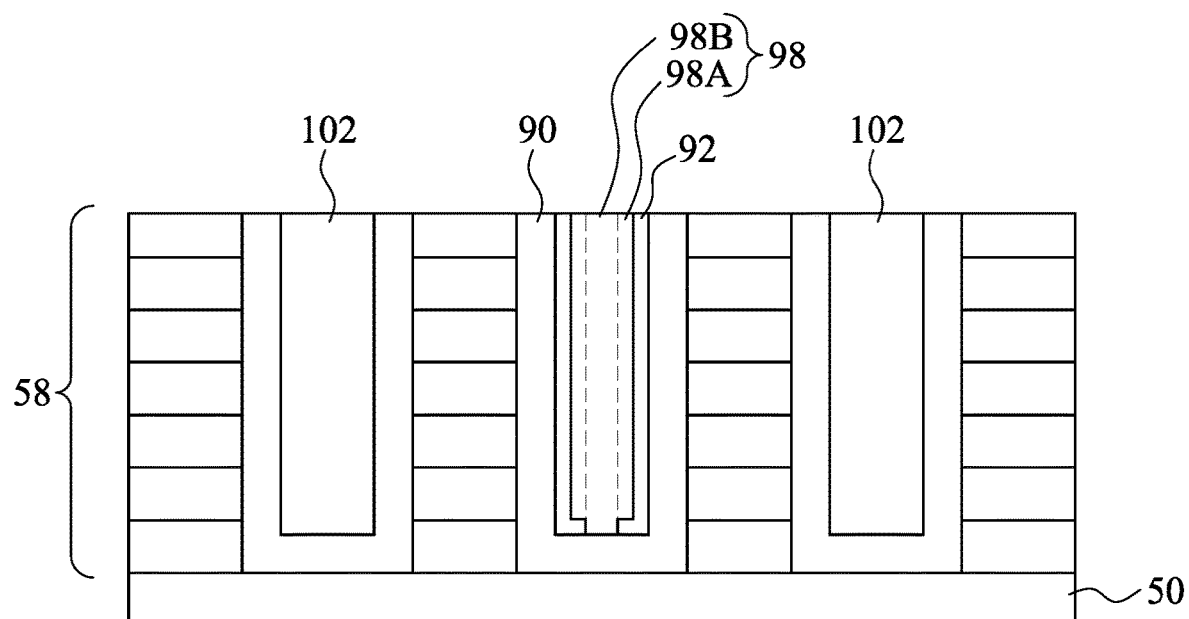

In FIGS. 25A, 25B, and 25C, a dielectric material 102 is deposited in and fills the trenches 100. FIG. 25C illustrates a cross-sectional view of line C-C' in FIG. 25B. The dielectric layer 102 may include, for example, silicon oxide, silicon nitride, silicon oxynitride, or the like, which may be deposited by CVD, PVD, ALD, PECVD, or the like. The dielectric layer 102 may extend along sidewalls and a bottom surface of the trenches 86 over the OS layer 92. After deposition, a planarization process (e.g., a CMP, etch back, or the like) may be performed to remove excess portions of the dielectric material 102. In the resulting structure, top surfaces of the multi-layer stack 58, the memory film 90, the OS layer 92, and the dielectric material 102 may be substantially level (e.g., within process variations). In some embodiments, materials of the dielectric materials 98 and 102 may be selected so that they may be etched selectively relative each other. For example, in some embodiments, the dielectric material 98 is an oxide and the dielectric material 102 is a nitride. In some embodiments, the dielectric material 98 is a nitride and the dielectric material 102 is an oxide. Other materials are also possible.

Figure 26A:
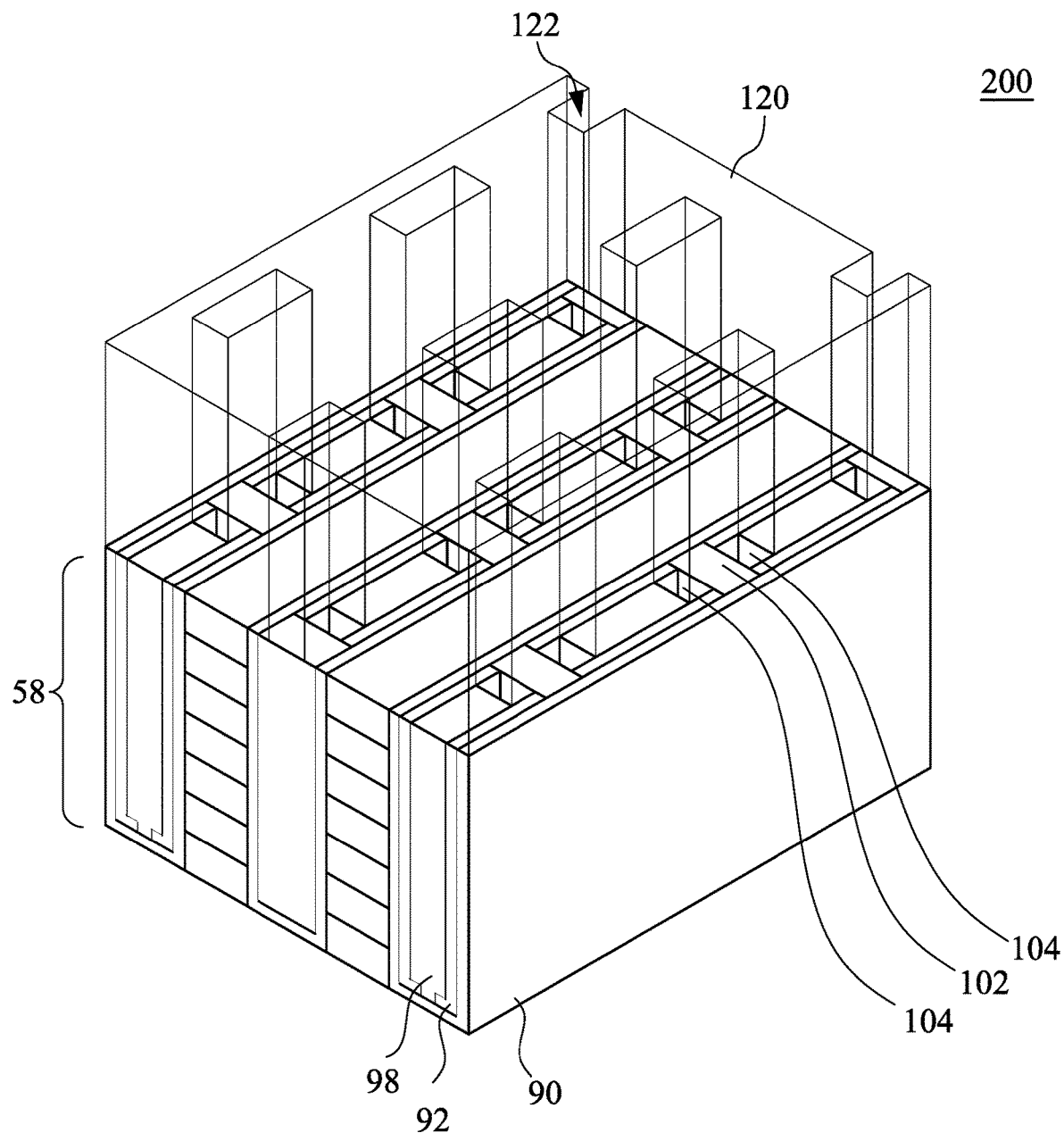
Figure 26B:
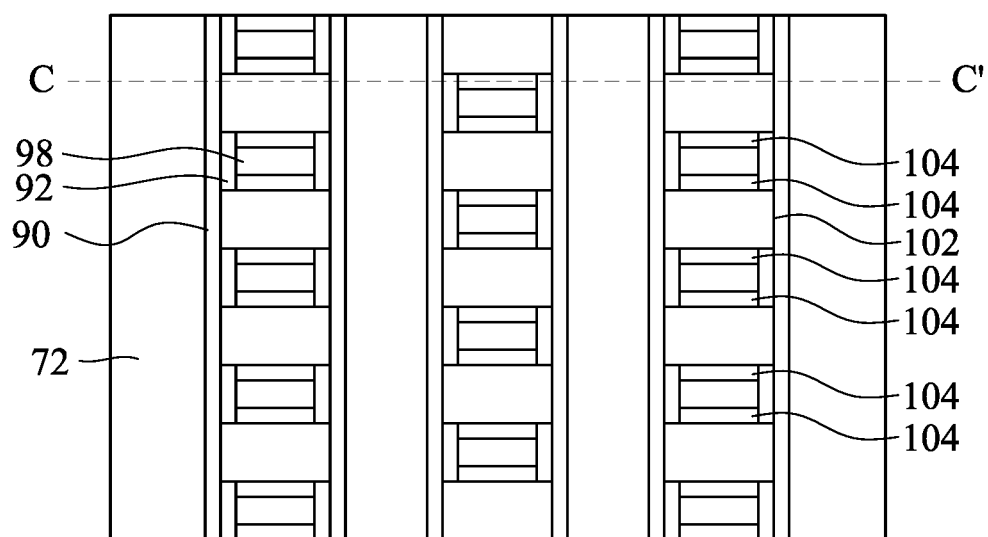
Figure 26C:
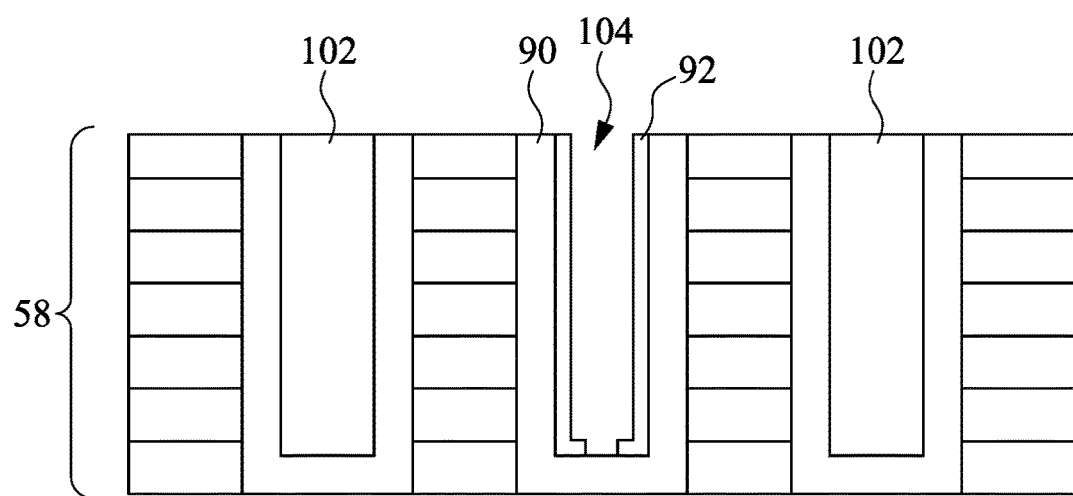

In FIGS. 26A, 26B, and 26C, trenches 104 are patterned for the conductive lines 106 and 108. FIG. 26C illustrates a cross-sectional view of line C-C' in FIG. 26B. The trenches 104 are patterned by patterning the dielectric material 98 (including the dielectric material 98A and the dielectric material 98B) using a combination of photolithography and etching, for example.

For example, a photoresist 120 may be deposited over the multi-layer stack 58, the dielectric material 98, the dielectric material 102, the OS layer 92, and the memory film 9o. The photoresist 120 can be formed by using a spin-on technique, for example. The photoresist 120 is patterned to define openings 122. Each of the openings 122 may overlap a corresponding region of the dielectric material 102, and each of the openings 122 may further partially expose two separate regions of the dielectric material 98. For example, each opening 122 may expose a region of the dielectric material 102; partially expose a first region of the dielectric material 98; and partially expose a second region of the dielectric material 98 that is separated from the first region of the dielectric material 98 by the region of the dielectric material 102. In this way, each of the openings 122 may define a pattern of a conductive line 106 and an adjacent conductive line 108 that are separated by the dielectric material 102. The photoresists can be patterned using acceptable photolithography techniques. For example, the photoresist 120 be exposed to light for patterning. After the exposure process, the photoresist 120 may be developed to remove exposed or unexposed portions of the photoresist depending on whether a negative or positive resist is used, thereby defining a patterning of the form openings 122.

Subsequently, portions of the dielectric material 98 exposed by the openings 122 may be removed by etching, for example. The etching may be any acceptable etch process, such as by wet or dry etching, a reactive ion etch (RIE), neutral beam etch (NBE), the like, or a combination thereof. The etching may be anisotropic. The etching process may use an etchant that etches the dielectric material 98 without significantly etching the dielectric material 102. As a result, even though the openings 122 expose the dielectric material 102, the dielectric material 102 may not be significantly removed. A pattern of the trenches 104 may correspond to the conductive lines 106 and 108 (see FIGS. 27A, 27B, and 27C). For example, a portion of the dielectric material 98 may remain between each pair of the trenches 104, and the dielectric material 102 may be disposed between adjacent pairs of the trenches 104. After the trenches 104 are patterned, the photoresist 120 may be removed by ashing, for example.

Figure 27A:
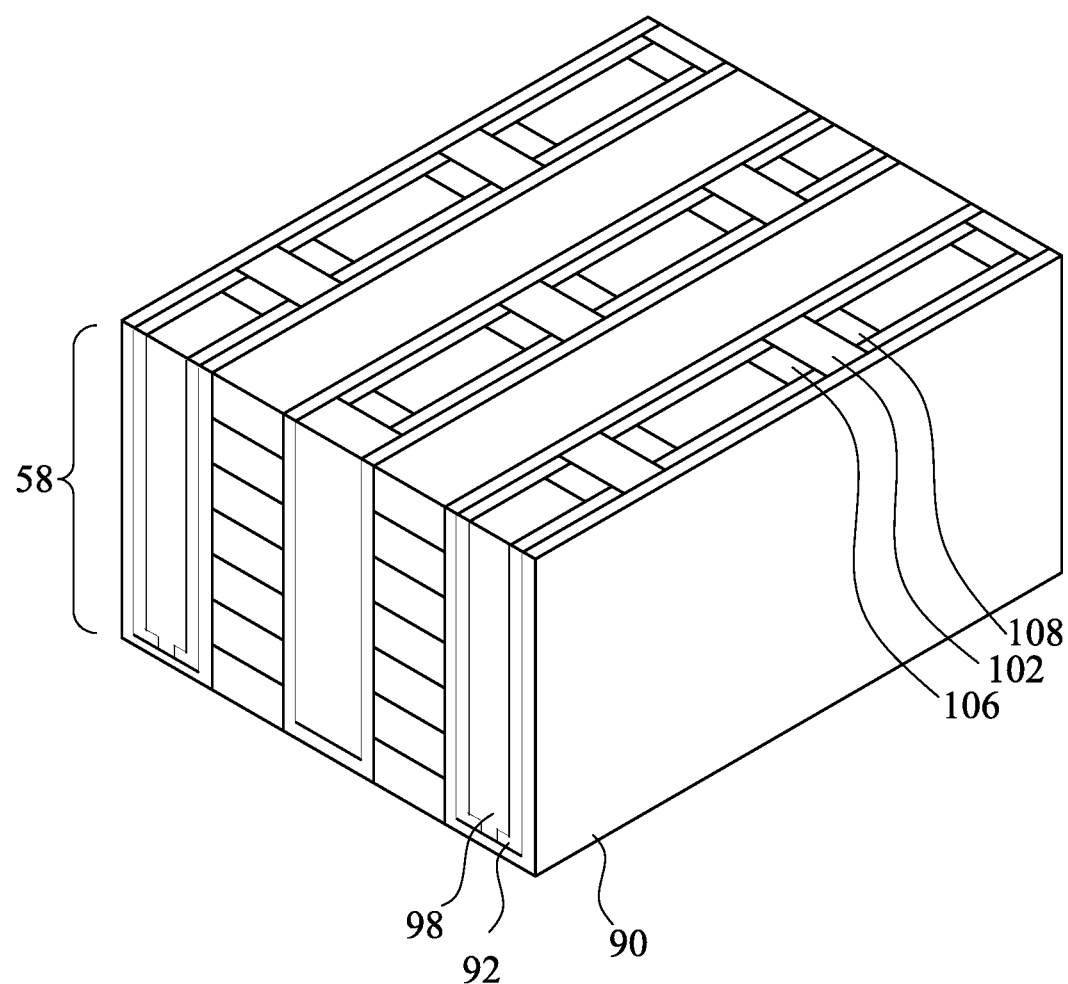
Figure 27B:
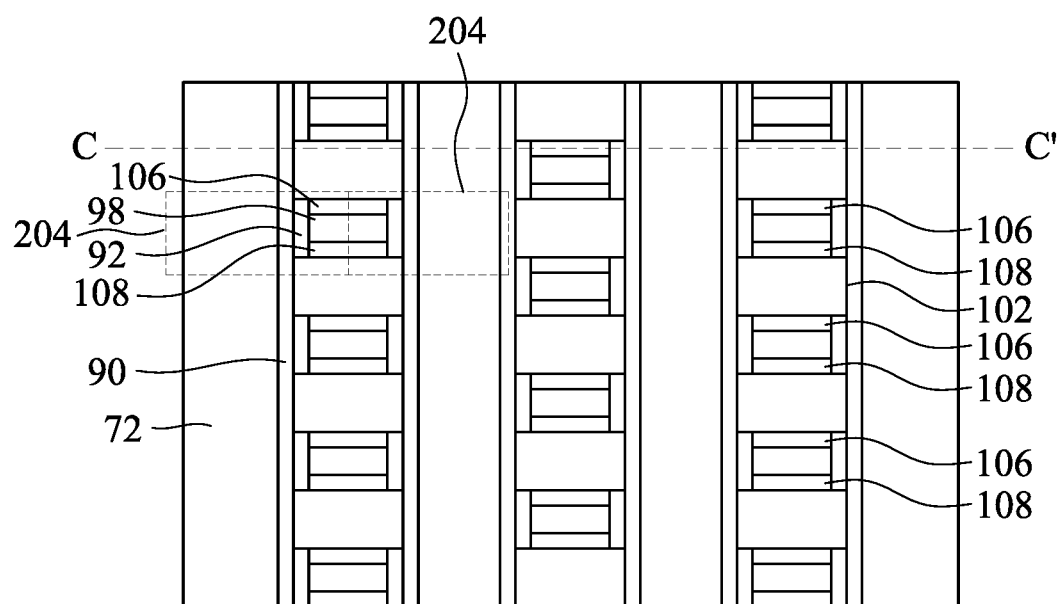
Figure 27C:
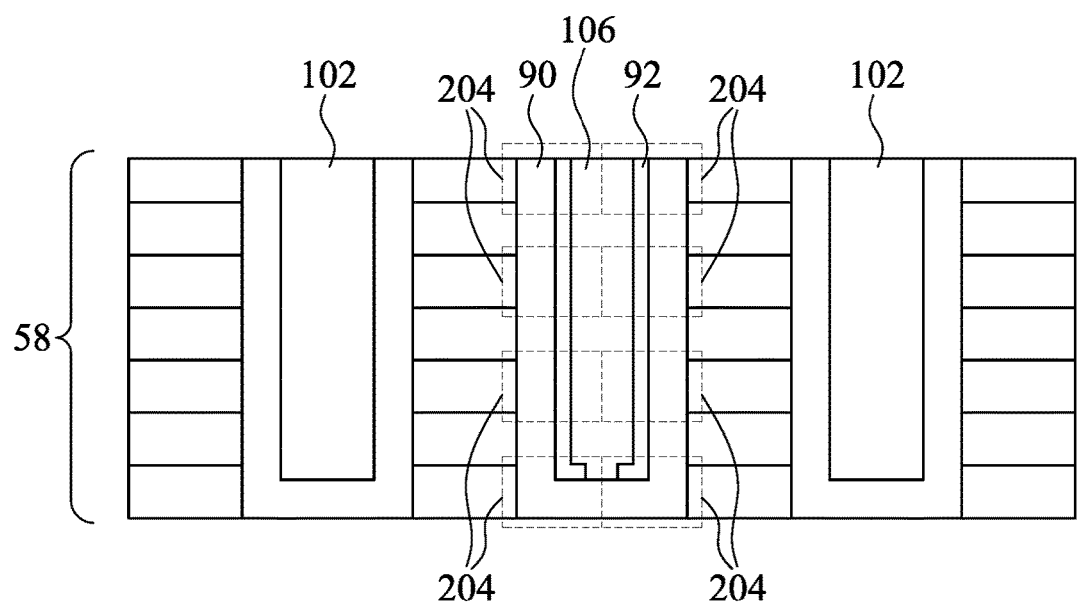

In FIGS. 27A, 27B, and 27C the trenches 104 are filled with a conductive material to form the conductive lines 106 and 108. FIG. 27C illustrates a cross-sectional view of line C-C' in FIG. 27B. The conductive lines 106 and 108 may each comprise a conductive material, such as, copper, titanium, titanium nitride, tantalum, tantalum nitride, tungsten, ruthenium, aluminum, combinations thereof, or the like, which may be each formed using, for example, CVD, ALD, PVD, PECVD, or the like. After the conductive lines 106 and 108 are deposited, a planarization (e.g., a CMP, etch back, or the like) may be performed to remove excess portions of the conductive material, thereby forming the conductive lines 106 and 108. In the resulting structure, top surfaces of the multi-layer stack 58, the memory film 90, the OS layer 92, the conductive lines 106, and the conductive lines 108 may be substantially level (e.g., within process variations). The conductive lines 106 may correspond to bit lines in the memory array, and the conductive lines 108 may correspond to source lines in the memory array 200. Although FIG. 27C illustrates a cross-sectional view that only shows the conductive lines 106, a cross-sectional view of the conductive lines 108 may be similar.

Thus stacked TFTs 204 may be formed in the memory array 200. Each TFT 204 comprises a gate electrode (e.g., a portion of a corresponding conductive line 72), a gate dielectric (e.g., a portion of a corresponding memory film 90), a channel region (e.g., a portion of a corresponding OS layer 92), and source and drain electrodes (e.g., portions of corresponding conductive lines 106 and 108). The dielectric material 102 isolates adjacent TFTs 204 in a same column and at a same vertical level. The TFTs 204 may be disposed in an array of vertically stacked rows and columns. The conductive lines 72 run horizontally (e.g., parallel to a major surface of an underlying substrate) and intersect the conductive lines 106 and 108, which run vertically (e.g., perpendicular the more surface of the underlying substrate 50).

Figure 28A:
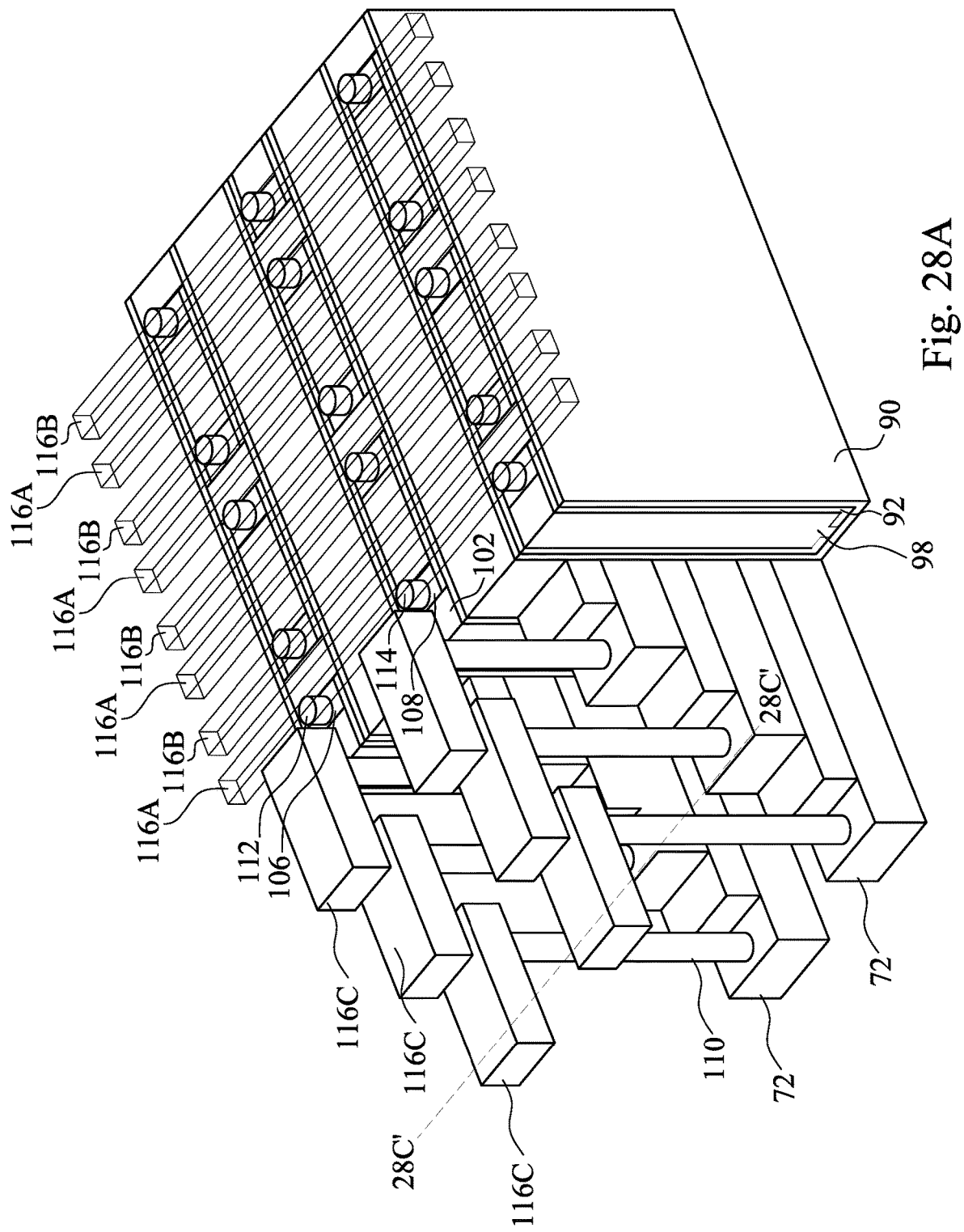
Figure 28B:
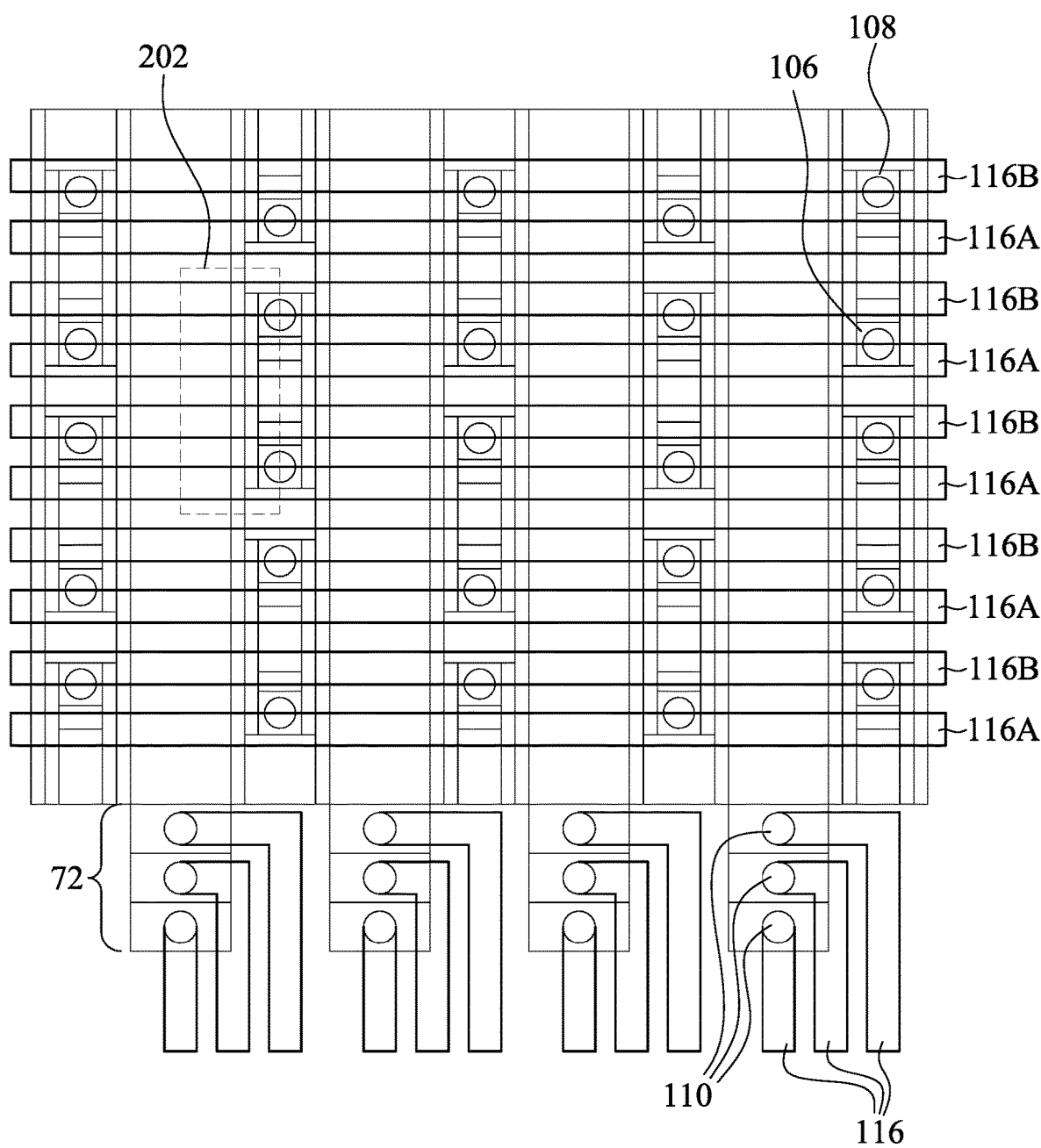
Figure 28C:
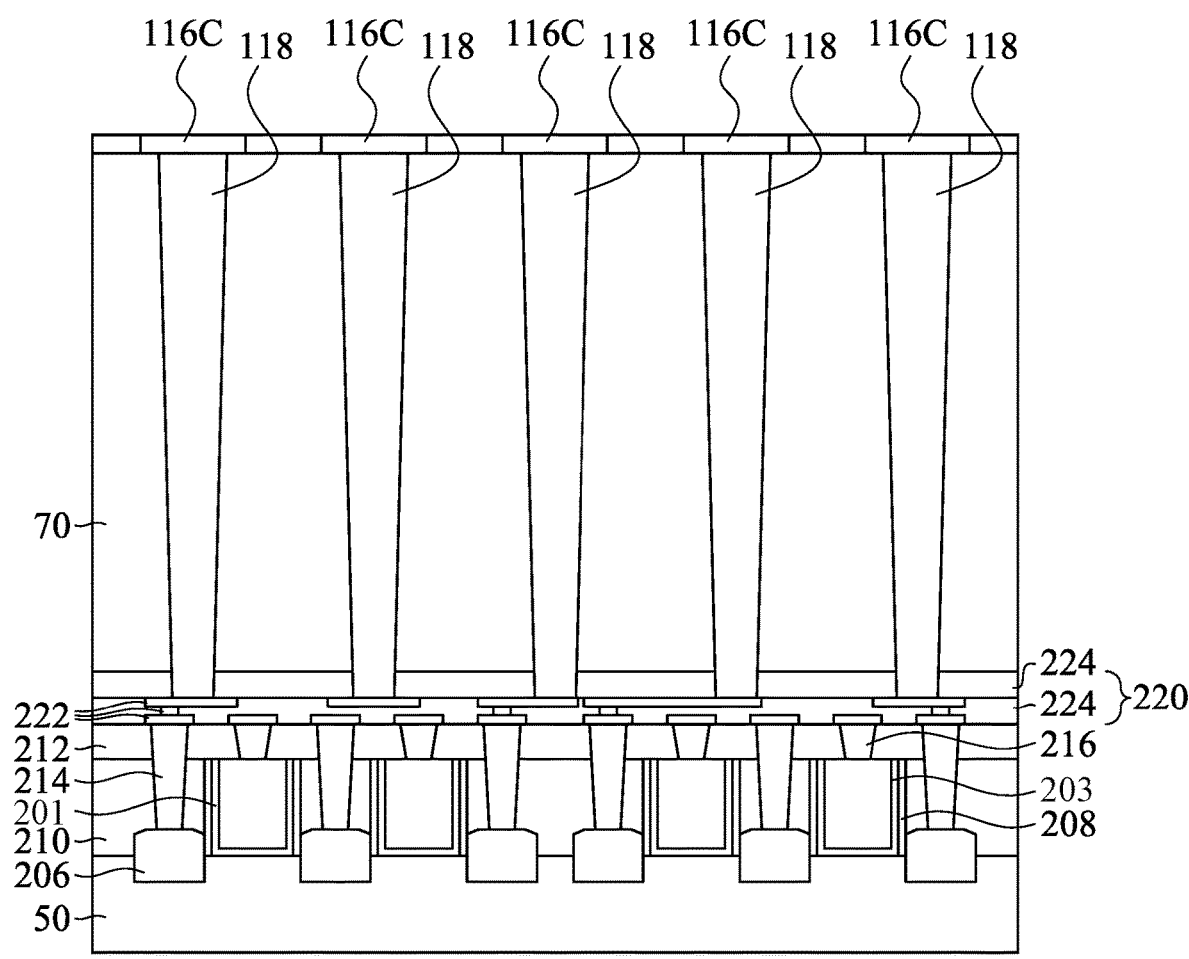
Figure 28D:
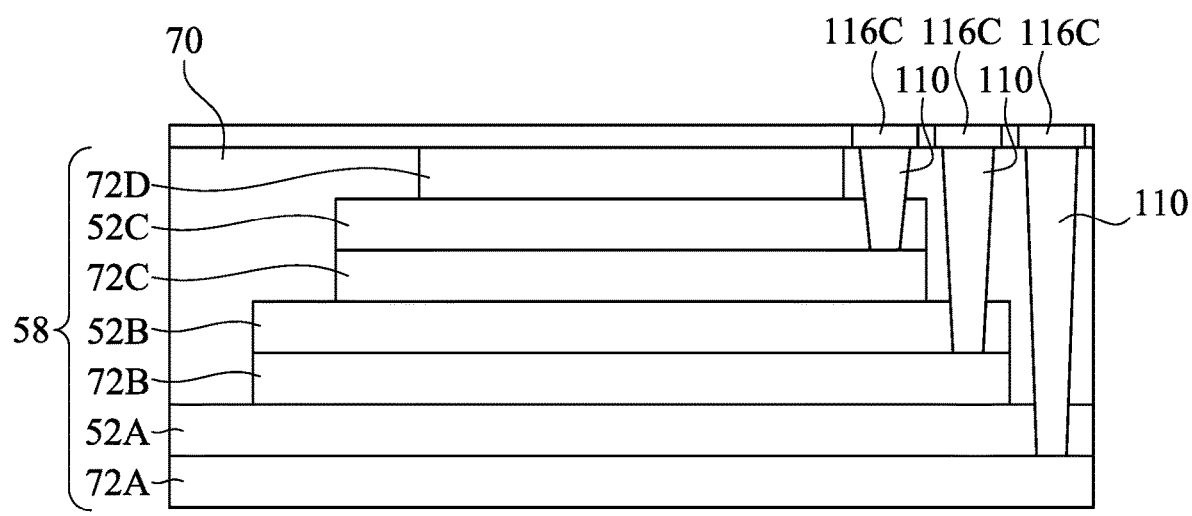

In FIGS. 28A, 28B, 28C, and 28D, contacts 110 are made to the conductive lines 72, the conductive lines 106, and the conductive lines 108. FIG. 28A illustrates a perspective view of the memory array 200; FIG. 28B illustrates a top-down view of the memory array 200; and FIG. 28C illustrates a cross-sectional view of the device and underlying substrate alone the line 28C'-28C' of FIG. 28A; and FIG. 28D illustrates a cross-sectional view of the device along line B-B' of FIG. 1A. In some embodiments, the staircase shape of the conductive lines 72 may provide a surface on each of the conductive lines 72 for the conductive contacts 110 to land on. Forming the contacts 110 may include patterning openings in the IMD 70 and the dielectric layers 52 to expose portions of the conductive layers 54 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 70. The remaining liner and conductive material form the contacts 110 in the openings.

As also illustrated by the perspective view of FIG. 28A, conductive contacts 112 and 114 may also be made to the conductive lines 106 and the conductive lines 108, respectively. The conductive contacts 110, 112, and 114 may be electrically connected to conductive lines 116A, 116B, and 116C, respectively, which connect the memory array to an underlying/overlying circuitry (e.g., control circuitry) and/or signal, power, and ground lines in the semiconductor die. For example, conductive vias 118 may extend through the IMD 70 to electrically connect conductive lines 116C to the underlying circuitry of the interconnect structure 220 and the active devices on the substrate 50 as illustrated by FIG. 28C. Other conductive vias may be formed through the IMD 70 to electrically connect the conductive lines 116A and 116B to the underlying circuitry of the interconnect structure 220. In alternate embodiments, routing and/or power lines to and from the memory array may be provided by an interconnect structure formed over the memory array 200 in addition to or in lieu of the interconnect structure 220. Accordingly, the memory array 200 may be completed.

Although the embodiments of FIGS. 2 through 28B illustrate a particular pattern for the conductive lines 106 and 108, other configurations are also possible. For example, in some embodiments, the routing lines for the word lines and/or the bit lines and source lines may be disposed under the memory array 200 instead of above the memory array 200.

Figure 29:
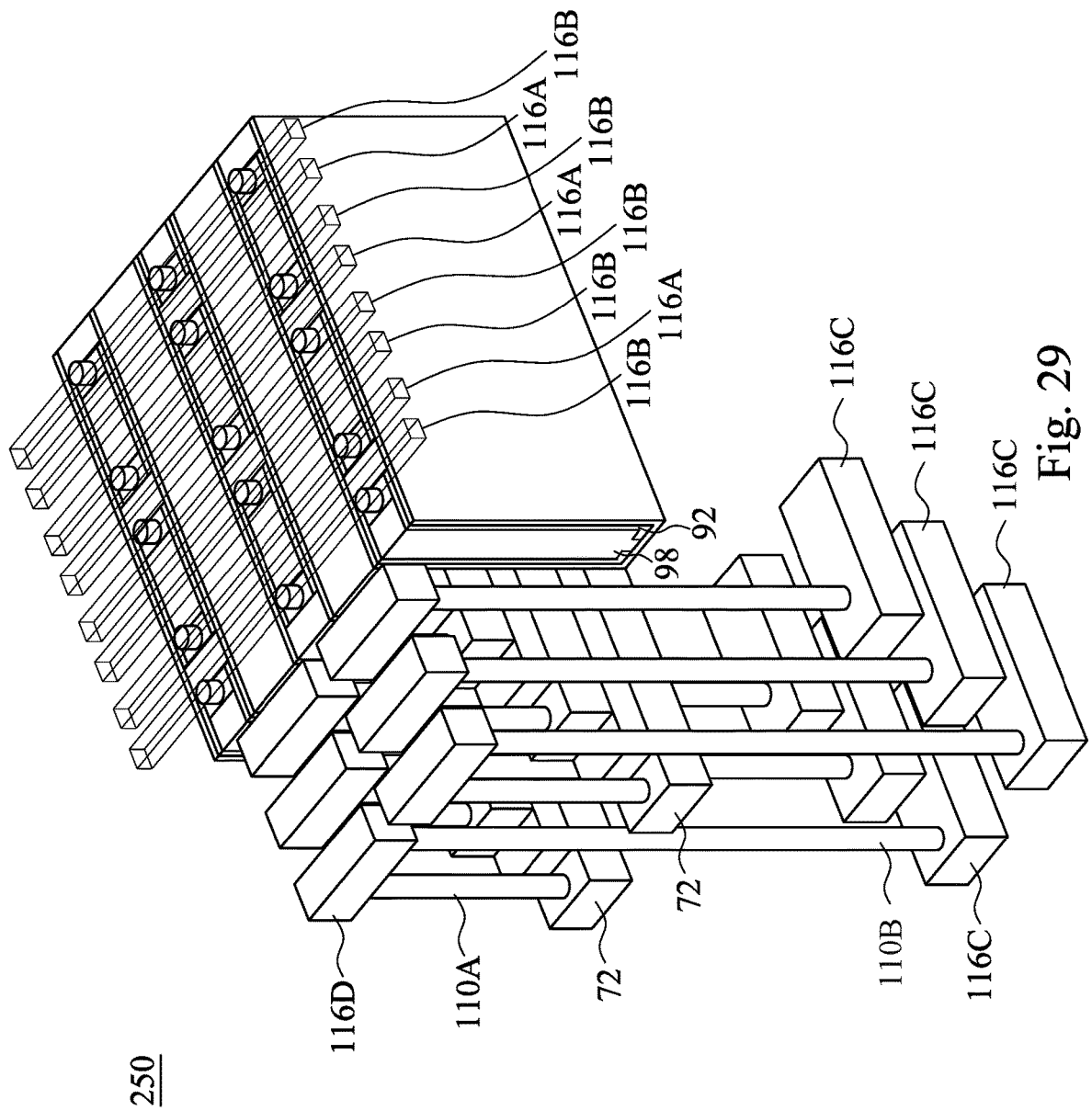
FIG. 29 illustrates varying views of a memory array in accordance with some embodiments.

For example, FIG. 29 illustrates a perspective view of a memory array 250 where routing lines for the conductive lines 72 (e.g., word lines) are disposed under the memory cells of the memory array 250. The memory array 250 may be similar to the memory array 200 where like reference numerals indicate like elements formed by like processes. As illustrated, the conductive lines 72 are connected to the underlying conductive lines 116C by contacts 110A, conductive lines 116D, and contacts 110B. Specifically, the conductive lines 72 are electrically connected to overlying conductive lines 116D by the contacts 110A. The conductive lines 116D provide routing and are connected to the underlying conductive lines 116C by contacts 110B.

Figure 30:
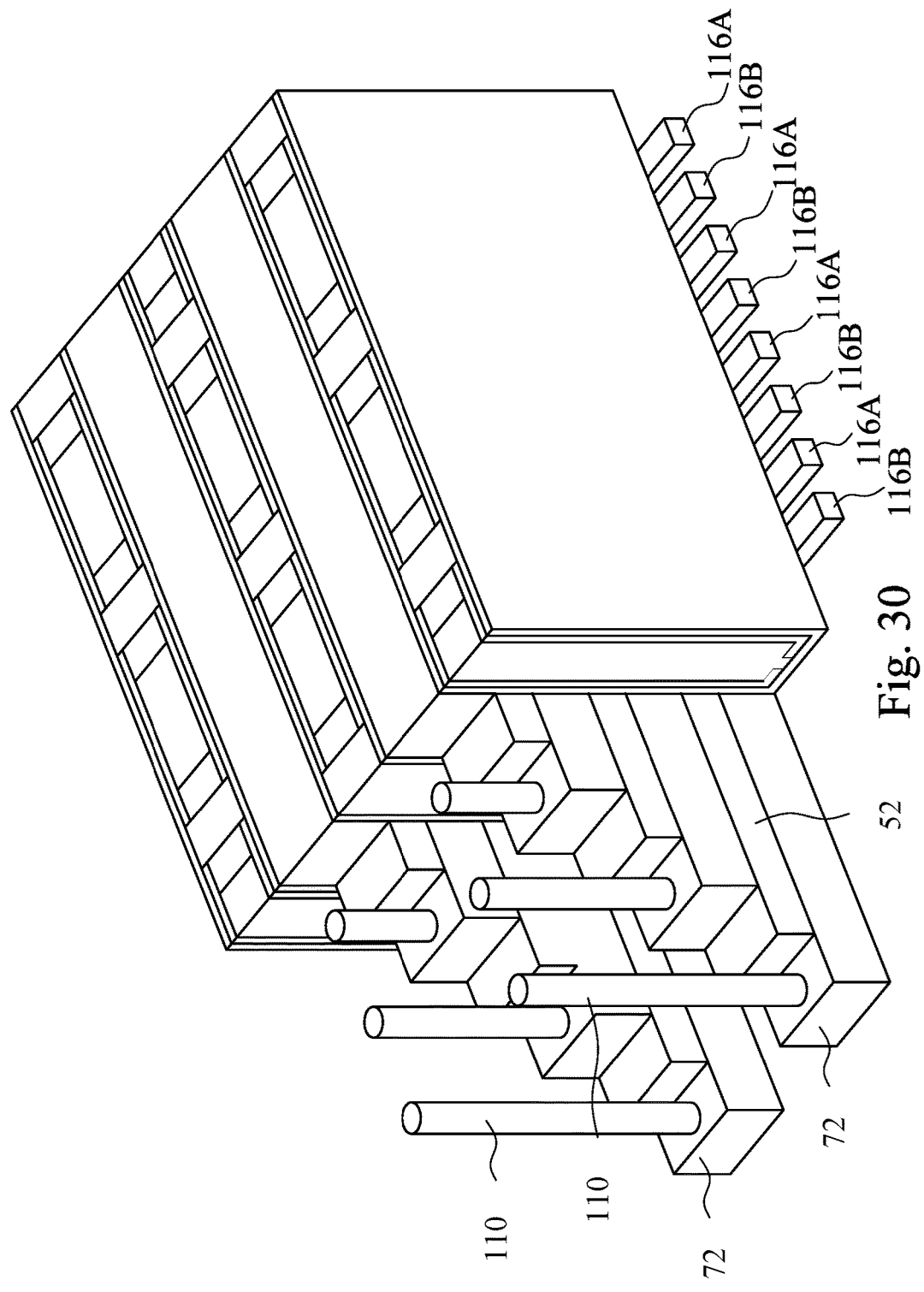
FIG. 30 illustrates varying views of a memory array in accordance with some embodiments.

As another example, FIG. 30 illustrates a perspective view of a memory array 300 where routing lines for the conductive lines 106 and 108 (e.g., bit lines and source lines) are disposed under the memory cells of the memory array 300. The memory array 300 may be similar to the memory array 200 where like reference numerals indicate like elements formed by like processes. As illustrated, the conductive lines 106 and 108 are electrically connected to underlying conductive lines 116A and 116B. In the memory array 300, routing for the conductive lines 72 may be disposed above (e.g., as illustrated in FIGS. 28A-28D) or below (e.g., as illustrated in FIG. 29) the memory cells.

Various embodiments provide a 3D memory array with a plurality of vertically stacked memory cells. Each memory cell includes a TFT having a word line region acting as a gate electrode, a bit line region acting as a first source/drain electrode, and a source line region acting as a second source/drain electrode. Each TFT further includes an insulating memory film (e.g., as a gate dielectric) and an OS channel region. In some embodiments, the word lines may run in a horizontal direction (e.g., parallel to a major surface of a semiconductor substrate) while the source lines and bit lines may run in a vertical direction (e.g., perpendicular to a major surface of the semiconductor substrate). Advantages may be achieved with the 3D memory array architecture including but not limited to reduced memory cell size, increased density, reduced memory array footprint (e.g., stacking height), and manufacturing ease.

In some embodiments, a device includes a semiconductor substrate; a first word line over the semiconductor substrate, the first word line providing a first gate electrode for a first transistor; and a second word line over the first word line. The second word line is insulated from the first word line by a first dielectric material, and the second word line providing a second gate electrode for a second transistor over the first transistor. The device further including a source line intersecting the first word line and the second word line; a bit line intersecting the first word line and the second word line; a memory film between the first word line and the source line; and a first semiconductor material between the memory film and the source line. Optionally, in some embodiments, the source line provides a first source/drain region for the first transistor and a second source/drain region for the second transistor, and wherein the bit line provides a third source/drain region for the first transistor and a fourth source/drain region for the second transistor. Optionally, in some embodiments, the device further includes a second source line intersecting the first word line and the second word line, wherein in the second source line provides a fifth source/drain region for a third transistor; and a second bit line intersecting the first word line and the second word line, wherein in the second bit line provides a sixth source/drain region for the third transistor, and wherein the first word line provides a third gate electrode for the third transistor. Optionally, in some embodiments, the device further includes a second semiconductor material between the first word line and the second source line, wherein the second semiconductor material is insulated from the first semiconductor material by a third dielectric material. Optionally, in some embodiments, the memory film is further disposed between the first word line and the second semiconductor material, and wherein the memory film extends continuously from the first semiconductor material to the second semiconductor material. Optionally, in some embodiments, the memory film is a ferroelectric material. Optionally, in some embodiments, the first word line is longer than the second word line.

In some embodiments, a device includes a semiconductor substrate; a first memory cell over the semiconductor substrate, the first memory cell comprising a first thin film transistor, wherein the first thin film transistor comprises: a gate electrode comprising a portion of a first word line, wherein the first word line extends in a direction parallel to a top surface of the semiconductor substrate; a first portion of a ferroelectric material, the first portion of the ferroelectric material being on a sidewall of the first word line; and a first channel region on a sidewall of the ferroelectric material; a source line, wherein a first portion of the source line provides a first source/drain electrode for the first thin film transistor, and wherein the source line extends in a direction perpendicular to the top surface of the semiconductor substrate; a bit line, wherein a first portion of the bit line provides a second source/drain electrode for the first thin film transistor, and wherein the bit line extends in a direction perpendicular to the top surface of the semiconductor substrate; and a second memory cell over the first memory cell. Optionally, in some embodiments, the second memory cell comprising a second thin film transistor, wherein a second portion of the source line provides a first source/drain electrode for the second thin film transistor, and wherein a second portion of the bit line provides a second source/drain electrode for the second thin film transistor. Optionally, in some embodiments, the device further includes a second word line over the first word line, wherein a gate electrode of the second thin film transistor comprises a portion of the second word line, and wherein the first word line is longer than the second word line. Optionally, in some embodiments, the first word line is electrically connected to a second word line disposed above the second memory cell. Optionally, in some embodiments, the first word line is electrically connected to a second word line disposed under the first memory cell. Optionally, in some embodiments, the source line is electrically connected to a second source line disposed above the second memory cell. Optionally, in some embodiments, the source line is electrically connected to a second source line disposed under the first memory cell.

In some embodiments, a method includes forming a first conductive line and a second conductive line over a semiconductor substrate, wherein the second conductive line is disposed over the first conductive line and is insulated from the first conductive line, and wherein the second conductive line is shorter than the first conductive line; patterning a first trench extending through the first conductive line and the second conductive line; depositing a memory film along sidewalls and a bottom surface of the first trench; depositing an oxide semiconductor (OS) layer over the memory film, the OS layer extending along the sidewalls and the bottom surface of the first trench; depositing a first dielectric material over and contacting the OS layer; patterning a second trench and a third trench each extending through the first dielectric material; and forming a third conductive line in the second trench and a fourth conductive line in the third trench. Optionally, in some embodiments, the method further includes patterning a fourth trench through the first dielectric material before patterning the second trench and the third trench; and filling the fourth trench with a second dielectric material, wherein patterning the second trench and the third trench comprises an etching process that selectively etches the first dielectric material selective to the second dielectric material. Optionally, in some embodiments, the method further includes forming a word line over and electrically connected to the first conductive line. Optionally, in some embodiments, the first conductive line is electrically connected to a word line under the first conductive line. Optionally, in some embodiments, the method further includes forming a source line over and electrically connected to the third conductive line; and forming a bit line over and electrically connected to the fourth conductive line. Optionally, in some embodiments, the third conductive line is electrically connected to a source line under the first conductive line, and wherein the fourth conductive line is electrically connected to a bit line under the first conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first conductive line and a second conductive line over a semiconductor substrate, wherein the second conductive line is disposed over the first conductive line and is insulated from the first conductive line, and wherein the second conductive line is shorter than the first conductive line;
    patterning a first trench extending through the first conductive line and the second conductive line;
    depositing a memory film along sidewalls and a bottom surface of the first trench;
    depositing an oxide semiconductor (OS) layer over the memory film, the OS layer extending along the sidewalls and the bottom surface of the first trench;
    forming a first dielectric material over and contacting the OS layer;
    patterning a second trench and a third trench each extending through the first dielectric material; and
    after patterning the second trench and the third trench, forming a third conductive line in the second trench and a fourth conductive line in the third trench by filling the second trench and the third trench with a conductive material, wherein the first dielectric material extends continuously from the third conductive line to the fourth conductive line.

2. The method of claim 1, further comprising:
    patterning a fourth trench through the first dielectric material before patterning the second trench and the third trench; and
    filling the fourth trench with a second dielectric material, wherein patterning the second trench and the third trench comprises an etching process that selectively etches the first dielectric material selective to the second dielectric material.

3. The method of claim 1, further comprising forming a word line over and electrically connected to the first conductive line.

4. The method of claim 1, wherein the first conductive line is electrically connected to a word line under the first conductive line.

5. The method of claim 1, further comprising:
    forming a source line over and electrically connected to the third conductive line; and
    forming a bit line over and electrically connected to the fourth conductive line.

6. The method of claim 1, wherein the third conductive line is electrically connected to a source line under the first conductive line, and wherein the fourth conductive line is electrically connected to a bit line under the first conductive line.

7. The method of claim 1, wherein forming the first conductive line and the second conductive line over the semiconductor substrate comprises forming the first conductive line and the second conductive line over active devices on the semiconductor substrate.

8. The method of claim 1, wherein forming the first dielectric material over and contacting the OS layer comprises:
- depositing a first portion of the first dielectric material in the first trench and on sidewalls of the OS layer;
- extending the first trench through the OS layer using the first portion of the first dielectric material as a mask; and
- depositing a second portion of the first dielectric material on the first portion of the first dielectric material.

9. A method, comprising:
- forming a first conductive line over a second conductive line, the first conductive line being separated from the second conductive line by a dielectric layer;
- etching a first opening, the first opening extending through the first conductive line, the second conductive line, and the dielectric layer;
- depositing an oxide semiconductor on opposing sidewalls of the first opening;
- after depositing the oxide semiconductor, filling remaining portions of the first opening with a first dielectric material, the first dielectric material extending between opposing sidewalls of the oxide semiconductor; and
- forming a third conductive line and a fourth conductive line extending through the first dielectric material, wherein the oxide semiconductor extends directly under the third conductive line.

10. The method of claim 9, further comprising depositing a memory film along the opposing sidewalls of the first opening, wherein the oxide semiconductor is deposited over the memory film.

11. The method of claim 10, wherein the memory film is a ferroelectric material.

12. The method of claim 10, further comprising:
- etching a second opening, the second opening extending through the first conductive line, the second conductive line, and the dielectric layer; and
- filling the second opening with a second dielectric material, the second dielectric material extending between opposing sidewalls of the memory film.

13. The method of claim 9, wherein forming the first conductive line comprises patterning the first conductive line so that the second conductive line extends laterally past the first conductive line.

14. The method of claim 9, wherein the third conductive line is electrically connected to a bit line under the second conductive line, and wherein the fourth conductive line is electrically connected to a source line under the second conductive line, the bit line and the source line being disposed at a same level.

15. The method of claim 9, wherein the third conductive line is electrically connected to a bit line above the first conductive line, and wherein the fourth conductive line is electrically connected to a source line above the first conductive line, the bit line and the source line being disposed at a same level.

16. A method, comprising:
- forming a first word line and a second word line over an active device on a semiconductor substrate, wherein the second word line is disposed over the first word line and is insulated from the first word line;
- patterning a first trench extending through the first word line and the second word line;
- depositing a memory film along sidewalls and a bottom surface of the first trench;
- depositing a semiconductor layer over the memory film and in the first trench;
- forming a first dielectric material over the semiconductor layer and in the first trench, wherein forming the first dielectric material comprises:
- depositing a first portion of the first dielectric material over the semiconductor layer in the first trench;
- etching an opening through the semiconductor layer using the first portion of the first dielectric material as a mask; and
- depositing a second portion of the first dielectric material in the first trench over the first portion of the first dielectric material and in the opening through the semiconductor layer;
- patterning a second trench and a third trench each extending through the first dielectric material; and
- forming a source line in the second trench and a bit line in the third trench, the source line being insulated from the bit line by remaining portions of the first dielectric material.

17. The method of claim 16, further comprising patterning the second word line to be shorter than the first word line.

18. The method of claim 16, wherein the semiconductor layer comprises indium.

19. The method of claim 18, wherein the semiconductor layer comprises $In_xGa_yZn_zMO$, wherein M is Ti, Al, Ag, Si, or Sn, and wherein X, Y, and Z are each a number between 0 and 1.

20. The method of claim 16, further comprising:
- patterning a fourth trench through the first dielectric material before patterning the second trench and the third trench; and
- filling the fourth trench with a second dielectric material, wherein patterning the second trench and the third trench comprises an etching process that selectively etches the first dielectric material at a rate faster than that of the second dielectric material.

* * * * *